United States Patent
Ohkubo et al.

(10) Patent No.: US 10,629,438 B2
(45) Date of Patent: Apr. 21, 2020

(54) LASER DOPING APPARATUS AND LASER DOPING METHOD

(71) Applicants: Kyushu University, Fukuoka (JP); Gigaphoton Inc., Tochigi (JP)

(72) Inventors: Tomoyuki Ohkubo, Fukuoka (JP); Hiroshi Ikenoue, Fukuoka (JP); Akihiro Ikeda, Fukuoka (JP); Tanemasa Asano, Fukuoka (JP); Osamu Wakabayashi, Oyama (JP)

(73) Assignees: Kyushu University, Fukuoka (JP); Gigaphoton Inc., Tochigi (JP)

( * ) Notice: Subject to any disclaimer, the term of this patent is extended or adjusted under 35 U.S.C. 154(b) by 0 days.

(21) Appl. No.: 16/393,609

(22) Filed: Apr. 24, 2019

(65) Prior Publication Data

US 2019/0252190 A1 Aug. 15, 2019

Related U.S. Application Data

(63) Continuation of application No. 15/679,022, filed on Aug. 16, 2017, now abandoned, which is a
(Continued)

(51) Int. Cl.
*H01L 21/24* (2006.01)
*H01L 21/04* (2006.01)
(Continued)

(52) U.S. Cl.
CPC ........ *H01L 21/0455* (2013.01); *H01L 21/268* (2013.01); *H01S 3/005* (2013.01);
(Continued)

(58) Field of Classification Search
CPC ... H01L 21/0455; H01L 21/268; H01S 3/005; H01S 3/0057; H01S 3/09702; H01S 3/225; H01S 3/10038; H01S 3/10046
(Continued)

(56) References Cited

U.S. PATENT DOCUMENTS 7,504,325 B2 3/2009 Koezuka et al.
8,148,663 B2 4/2012 Adams et al.
(Continued)

FOREIGN PATENT DOCUMENTS

JP H01-313930 A 12/1989
JP 2004-200497 A 7/2004
(Continued)

OTHER PUBLICATIONS

International Search Report issued in PCT/JP2015/058709; dated Jun. 9, 2015.
(Continued)

*Primary Examiner* — Vu A Vu
(74) *Attorney, Agent, or Firm* — Studebaker & Brackett PC

(57) ABSTRACT

The laser doping apparatus may irradiate a predetermined region of a semiconductor material with a pulse laser beam to perform doping. The laser doping apparatus may include: a solution supplying system configured to supply dopant-containing solution to the predetermined region, and a laser system including at least one laser device configured to output the pulse laser beam to be transmitted by the dopant-containing solution, and a time-domain pulse waveform changing apparatus configured to control a time-domain pulse waveform of the pulse laser beam.

20 Claims, 29 Drawing Sheets

Related U.S. Application Data continuation of application No. PCT/JP2015/058709, filed on Mar. 23, 2015.

(51) Int. Cl.
*H01S 3/00* (2006.01)
*H01L 21/268* (2006.01)
*H01S 3/097* (2006.01)
*H01S 3/225* (2006.01)
*H01S 3/10* (2006.01)

(52) U.S. Cl.
CPC ........ *H01S 3/0057* (2013.01); *H01S 3/09702* (2013.01); *H01S 3/225* (2013.01); *H01S 3/10038* (2013.01); *H01S 3/10046* (2013.01)

(58) Field of Classification Search
USPC .......................................................... 438/535
See application file for complete search history.

(56) References Cited

U.S. PATENT DOCUMENTS

| | | | |
|---|---|---|---|
| 8,603,902 B2 | 12/2013 | Mazur et al. | |
| 2002/0151115 A1* | 10/2002 | Nakajima | C23C 16/56 438/149 |
| 2005/0003594 A1 | 1/2005 | Koezuka et al. | |
| 2010/0144079 A1 | 6/2010 | Mayer et al. | |
| 2013/0327381 A1 | 12/2013 | Chung et al. | |
| 2014/0203194 A1 | 7/2014 | Nagano et al. | |
| 2015/0083915 A1* | 3/2015 | Nakata | G01J 1/1626 250/338.1 |
| 2015/0093519 A1* | 4/2015 | Dowden | C23C 14/28 427/596 |
| 2015/0102239 A1* | 4/2015 | Yanagida | H05G 2/005 250/504 R |
| 2016/0035603 A1 | 2/2016 | Ikenoue et al. | |

FOREIGN PATENT DOCUMENTS

| | | |
|---|---|---|
| JP | 2007-123300 A | 5/2007 |
| JP | 4387091 B2 | 12/2009 |
| JP | 4409231 B2 | 2/2010 |
| JP | 2010-525554 A | 7/2010 |
| JP | 2012-015461 A | 1/2012 |
| WO | 2014/156818 A1 | 10/2014 |

OTHER PUBLICATIONS

Koji Nishi et al.; "Phosphorus Doping into 4H—SiC by Irradiation of Excimer Laser in Phosphoric Solution"; Japanese Journal of Applied Physics; Jun. 20, 2013; pp. 06GF02-1-4; vol. 52, No. 6.

Daichi Marui et al.; "Aluminum Doping of 4H—SiC by Irradiation of Excimer Laser in Aluminum Chloride Solution"; Japanese Journal of Applied Physics; May 21, 2014; pp. 06JF03-1-4; vol. 102.

Akihiro Ikeda et al.; "Phosphorus Doping of 4H SiC by Liquid Immersion Excimer Laser Irradiation"; Applied Physics Letters; 2013; pp. 052104-1-4; vol. 102.

Akihiro Ikeda et al.; "Nitrogen Doping of 4H—SiC by KrF Excimer Laser Irradiation in Liquid Nitrogen"; Japanese Journal of Applied Physics; 2015; pp. 04DP02-1-4; vol. 54.

Y. Inoue et al.; "N-type Doping in 4H—SiC by Laser Irradiation in Chemical Solutions and its Diffusion Properties of Impurities"; Applied Physics Letters; 2013; p. 1; vol. 102.

International Preliminary Report on Patentability and Written Opinion issued in PCT/JP2015/058709; dated Sep. 26, 2017.

Office Action issued in JP 2017-507186; mailed by the Japanese Patent Office dated Dec. 4, 2018.

An Office Action mailed by the Japanese Patent Office dated Mar. 3, 2020, which corresponds to Japanese Patent Application No. 2019-069773 and is related to U.S. Appl. No. 16/393,609.

\* cited by examiner

LASER DOPING APPARATUS AND LASER DOPING METHOD

CROSS-REFERENCE TO RELATED APPLICATIONS

This application is a Continuation of U.S. patent application Ser. No. 15/679,022 filed Aug. 16, 2017, which is a continuation of International Patent Application No. PCT/JP2015/058709 filed Mar. 23, 2015.

TECHNICAL FIELD

The present disclosure relates to a laser doping apparatus and a laser doping method.

BACKGROUND ART

Silicon carbide (SiC) is now in developments as a next-stage material for a power device. As compared to silicon (Si) conventionally used as a semiconductor material, the SiC has characteristics of a high band gap, a high breakdown field (10 times as high as that of the Si), and a high thermal conductivity. The SiC also has high thermochemical stability.

Making transistors using the SiC may require doping impurities into the SiC. Conventionally, doping impurities into the Si may be performed by irradiating the Si with an ion beam of the impurities, and then applying a high temperature to activate the impurities. However, using such a conventional process on the SiC may result in a thermal damage on the SiC to form a lattice defect, degrading electrical characteristics of the SiC.

Non-patent Documents 1 to 5 listed below discuss laser doping in which the SiC is irradiated in dopant-containing solution with a pulse laser beam. However, sufficient doping depth may not be achieved in Non-patent Documents 1 to 5 as described below:

(1) Regarding an n-type dopant, doping depth of nitrogen (N) in a range of 100 nm to 200 nm is reported. However, doping depth of phosphor (P) is only around 30 nm.

(2) Regarding a p-type dopant, doping depth of aluminum (Al) of approximately 40 nm is reported. However, greater doping depth than that is not reported.

Non-patent Document 1: Akihiro Ikeda, Koji Nishi, Hiroshi Ikenoue, Tanemasa Asano, Phosphorus doping of 4H SiC by liquid immersion excimer laser irradiation, APPLIED PHYSICS LETTERS 102, 052104 (2013)

Non-patent Document 2: Koji Nishi, Akihiro Ikeda, Hiroshi Ikenoue, and Tanemasa Asano, Phosphorus doping into 4H-SiC by Irradiation of Excimer Laser in Phosphoric Solution, Japanese Journal of Applied Physics 52 (2013)

Non-patent Document 3: Daichi Marui, Akihiro Ikeda, Koji Nishi, Hiroshi Ikenoue, Tanemasa Asano, Aluminum doping of 4H-SiC by irradiation of excimer laser in aluminum chloride solution, Japanese Journal of Applied Physics 53 (2014)

Non-patent Document 4: Akihiro Ikeda, Daichi Marui, Hiroshi Ikenoue, Tanemasa Asano, Nitrogen doping of 4H-SiC by KrF excimer laser irradiation in liquid nitrogen, Japanese Journal of Applied Physics 54(2015)

Non-patent Document 5: Yuuki Inoue, Hiroshi Ikenoue, Akihiro Ikeda, Daisuke Nakamura, Tatsuo Okada, Tanemasa Asano, N-type Doping in 4H-SiC by Laser Irradiation in Chemical Solutions and its Diffusion Properties of Impurities, The 61st Japan Society of Applied Physics Spring Meeting (2014)

Patent Document 1: Japanese Patent No. 4387091
Patent Document 2: Japanese Patent No. 4409231
Patent Document 3: Japanese Patent Application Publication No. 2010-525554
Patent Document 4: International Publication No. WO 2014/156818

SUMMARY

A laser doping apparatus according to one aspect of the present disclosure may irradiate a predetermined region of a semiconductor material with a pulse laser beam to perform doping. The laser doping apparatus may include a solution supplying system configured to supply dopant-containing solution to the predetermined region, and a laser system including at least one laser device configured to output the pulse laser beam to be transmitted by the dopant-containing solution, and a time-domain pulse waveform changing apparatus configured to control a time-domain pulse waveform of the pulse laser beam.

A laser doping apparatus according to another aspect of the present disclosure may irradiate a predetermined region of a semiconductor material with a pulse laser beam to perform doping. The laser doping apparatus may include a solution supplying system configured to supply boron-containing solution to the predetermined region, and at least one laser device configured to output the pulse laser beam to be transmitted by the boron-containing solution.

A laser doping method according to still another aspect of the present disclosure may irradiate a predetermined region of a semiconductor material with a pulse laser beam to perform doping. The laser doping method may include supplying dopant-containing solution to the predetermined region, outputting the pulse laser beam to be transmitted by the dopant-containing solution, and controlling a time-domain pulse waveform of the pulse laser beam.

BRIEF DESCRIPTION OF DRAWINGS

Exemplary embodiments of the present disclosure will be described below with reference to the appended drawings.

FIG. 14B is a flowchart showing details of a process shown in FIG. 13 to control a variable slit 42a;

DESCRIPTION OF EMBODIMENTS

Contents

1. Outline
2. Laser Doping Apparatus of Comparative Example
2.1 Configuration of Laser Doping Apparatus
2.2 Operation of Laser Doping Apparatus
2.3 Problems
3. Laser Doping Apparatus Including Optical Pulse Stretcher (First Embodiment)
3.1 Configuration
3.2 Operation
3.3 Details of Optical Pulse Stretcher
3.4 Effect of First Embodiment
4. Laser Doping Apparatus Where Time-Domain Pulse Waveform is Changed (Second Embodiment)
4.1 Configuration
4.2 Details of Optical Pulse Stretcher
4.3 Process of Doping Controller
4.3.1 Main Flow
4.3.2 Details of S110
4.3.3 Details of S140
4.3.4 Details of S170
4.4 Modified Example of Process of Doping Controller
4.4.1 Main Flow
4.4.2 Details of S110a
4.4.3 Details of S140a
4.4.4 Details of S170a
5. Laser Doping Apparatus Where Form and Size of Irradiated Region are Changed (Third Embodiment)
5.1 Configuration
5.2 Process of Doping Controller
5.2.1 Main Flow
5.2.2 Details of S110b
5.2.3 Details of S180
6. Variation of Beam Splitter (Fourth Embodiment)
7. Laser Doping Apparatus Including Plurality of Laser Units (Fifth Embodiment)
7.1 Configuration and Operation
7.2 Process of Doping Controller
7.2.1 Main Flow
7.2.2 Details of S110c
7.2.3 Details of S140c
7.3 Effect
8. Laser Doping Apparatus Using Boron-Containing Solution (Sixth Embodiment)
9. Others
9.1 Details of Laser Device
9.2 Configuration of Fly-Eye Lens
9.3 Configuration of Controller Now, embodiments of the present disclosure will be described in detail with reference to the drawings. The embodiments described below are intended to be illustrative of the present disclosure and not to limit the content thereof. Not all the configurations and operations described in the embodiments are essential to the present disclosure. Identical reference symbols are assigned to identical elements and redundant descriptions are omitted.

1. Outline

The present disclosure relates to a laser doping apparatus or a laser doping method that irradiates a semiconductor material in dopant-containing solution with an ultraviolet-range pulse laser beam to perform doping into the semiconductor material.

Figure 1:
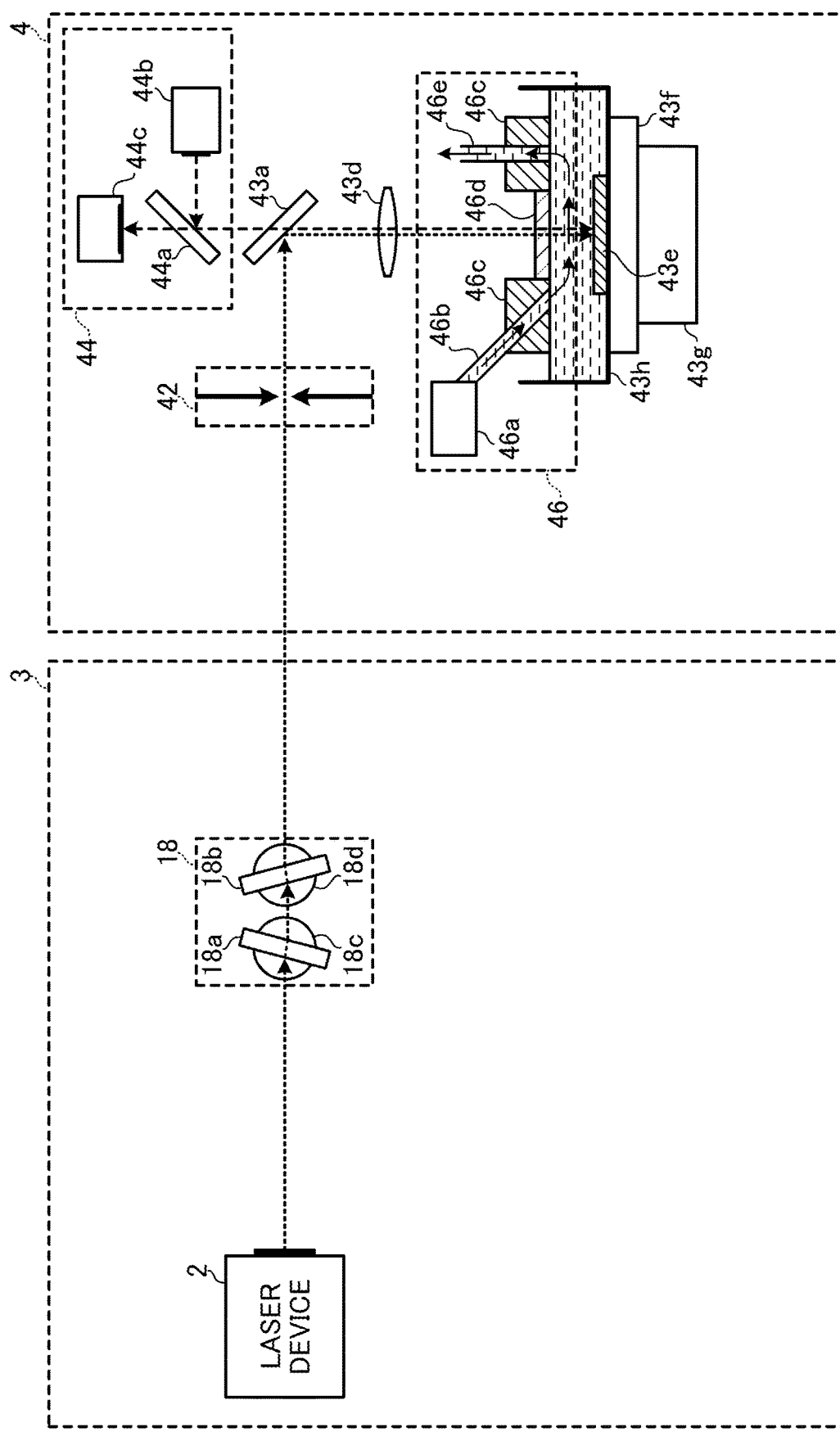
FIG. 1 schematically shows a configuration of a laser doping apparatus of a comparative example.

2. Laser Doping Apparatus of Comparative Example 2.1 Configuration of Laser Doping Apparatus FIG. 1 schematically shows a configuration of a laser doping apparatus of a comparative example. The laser doping apparatus may include a laser system 3 and a doping device 4.

The laser system 3 may include a laser device 2 and an attenuator 18. The laser device 2 may be an excimer laser device configured to output an ultraviolet-range pulse laser beam. Wavelength of the pulse laser beam may be selected such that dopant-containing solution used in the doping device 4 transmits the pulse laser beam at a high transmittance and that a semiconductor material constituting a workpiece 43e is less damaged. For example, the laser device 2 may be one using KrF or XeCl as a laser medium. Pulse width of the output pulse laser beam may be approximately 50 ns. In a KrF excimer laser device, the wavelength of the pulse laser beam may be approximately 248.4 nm. In a XeCl excimer laser device, the wavelength of the pulse laser beam may be approximately 308 nm.

The attenuator 18 may be disposed in an optical path of the pulse laser beam outputted from the laser device 2. The attenuator 18 may include two partial reflection mirrors 18a and 18b, and rotating stages 18c and 18d for the respective partial reflection mirrors. The two partial reflection mirrors 18a and 18b may be optical elements whose transmittances vary with incident angles of the pulse laser beam.

The doping device 4 may include a slit 42, a high-reflective mirror 43a, transfer optics 43d, a table 43f, an XYZ stage 43g, a vessel 43h, a solution supplying system 46, and a display device 44. The slit 42 may be disposed in the optical path of the pulse laser beam passed through the attenuator 18. The slit 42 may have two axes that are substantially perpendicular to each other. The slit 42 may be disposed such that a region having a uniform optical intensity distribution of a cross-section of the pulse laser beam passes through the slit 42.

The high-reflective mirror 43a may be a dichroic mirror that reflects the ultraviolet-range pulse laser beam outputted from the laser device 2 with high reflectance and transmits visible light. The high-reflective mirror 43a may be disposed such that the pulse laser beam passed through the slit 42 is reflected to enter the transfer optics 43d. The transfer optics 43d may include one or more convex lenses or may include one or more convex lenses and one or more concave lenses. The transfer optics 43d may include lenses where a correction of chromatic aberration has been made for wavelengths of visible light and ultraviolet light. For example, the transfer optics 43d may include a plurality of lenses configured by synthetic quarts and calcium fluoride.

The table 43f may support the vessel 43h. The vessel 43h may be configured to store the dopant-containing solution. The solution may be, for example, aluminum chloride aqueous solution that contains aluminum as dopant, ammonia aqueous solution that contains nitrogen as dopant, phosphoric acid aqueous solution that contains phosphor as dopant, or solution that contains other dopant.

The workpiece 43e may be made of a semiconductor material such as the SiC, diamond, GaN, etc., used in the power device. Crystal structure of the SiC is not limited but the workpiece 43e may be made of 4H-SiC, for example. The 4H-SiC may be SiC that has a hexagonal crystal structure having repetition of four layers. The workpiece 43e may be accommodated at a bottom of the vessel 43h so as to be immerged in the solution stored in the vessel 43h. A surface of an irradiated region of the workpiece 43e irradiated with the pulse laser beam may be substantially parallel to a liquid surface of the solution stored in the vessel 43h. At least a region of the workpiece 43e irradiated with the pulse laser beam may be submerged under the liquid surface of the solution in the vessel 43h.

The solution supplying system 46 may include a pump 46a, a solution supplying tube 46b, a plate 46c, a window 46d, and a solution discharging tube 46e. An output of the pump 46a may be connected to the solution supplying tube 46b. The solution supplying tube 46b may be fixed to the plate 46c. The solution supplying tube 46b may be inclined with the liquid surface. An output end of the solution supplying tube 46b may be directed to the region of the workpiece 43e to be irradiated with the pulse laser beam. The solution may thus flow along the surface of the region of the workpiece 43e. Further, the solution discharging tube 46e for discharging a part of the solution from the vessel 43h may be fixed to the plate 46c. The solution discharged through the solution discharging tube 46e may be refined as needed and stored in an unillustrated tank. The tank may be connected to an input of the pump 46a.

The XYZ stage 43g may support the table 43f. The XYZ stage 43g may control the position of the table 43f to adjust the position of the workpiece 43e accommodated in the vessel 43h.

The window 46d may be fixed to the plate 46c in an optical path of the pulse laser beam with which the workpiece 43e is irradiated. Material of the window 46d may be synthetic quarts, which may transmit the laser beam outputted from the excimer laser device. The lower surface of the window 46d may be in contact with the liquid surface of the solution. The upper surface of the window 46d may be above the liquid surface of the solution. Alternatively, the plate 46c, the upper surface thereof is above the liquid surface of the solution, may surround the periphery of the window 46d to prevent the solution from flowing on the upper surface of the window 46d.

The display device 44 may include a beam splitter 44a, an illumination device 44b, and a two-dimensional sensor 44c. The beam splitter 44a may be a half mirror to transmit approximately 50% of incident visible light and reflect another 50%. The illumination device 44b may be a lamp emitting the visible light.

The transfer optics 43d may be configured to form a transfer image of the slit 42 with the ultraviolet-range light, via the window 46d and the dopant-containing solution, on a first predetermined position. When the first predetermined position substantially coincides with a position of the surface of the workpiece 43e, the transfer optics 43d may form a transfer image of the surface of the workpiece 43e with the visible light, via the high-reflective mirror 43a and the beam splitter 44a, on a second predetermined position. The two-dimensional sensor 44c may be positioned such that a photosensitive surface of the two-dimensional sensor 44c substantially coincides with the second predetermined position.

2.2 Operation of Laser Doping Apparatus

Postures of the two partial reflection mirrors 18a and 18b may be controlled using the rotating stages 18c and 18d so that the incident angles of the pulse laser beam are kept approximately equal to each other and that their transmittances each becomes a desired transmittance. Thus, the pulse laser beam outputted from the laser device 2 may be attenuated into a pulse laser beam having desired pulse energy and may pass through the attenuator 18.

The pulse laser beam passed through the attenuator 18 may pass through the slit 42 having two axes perpendicular to each other. The pulse laser beam may be reflected by the high-reflective mirror 43a, and then be incident on the transfer optics 43d.

A part of the visible light outputted from the illumination device 44b may be reflected by the beam splitter 44a, transmitted by the high-reflective mirror 43a, the transfer optics 43d, the window 46d, and the dopant-containing solution, and be incident on the surface of the workpiece 43e.

The XYZ stage 43g may control the position of the table 43f such that the transfer optics 43d form the transfer image of the surface of the workpiece 43e with the visible light on the photosensitive surface of the two-dimensional sensor 44c. Such control may enable the transfer optics 43d to form the transfer image of the slit 42 with the ultraviolet-range light on the surface of the workpiece 43e. In other words, the pulse laser beam may transmit the window 46d and the dopant-containing solution and be incident on the surface of the workpiece 43e. The dopant may thus be diffused in a direction of depth of the workpiece 43e from the surface of the region where the transfer image of the slit 42 is formed.

As described above, the lower surface of the window 46d may be in contact with the solution, but the upper surface of the window 46d may not be in contact with the solution. This may suppress waves on the liquid surface due to flow of the solution generated by the solution supplying system 46. Deforming or moving the transfer image formed by the transfer optics 43d may then be suppressed.

A flow rate of the pump 46a may be controlled to generate flow of the solution in the vessel 43h. Even when the energy of the pulse laser beam generates bubbles in the solution, the flow of the solution may remove the bubbles from the periphery of the region irradiated with the pulse laser beam. Reducing clarity of the image formed by the transfer optics 43d may thus be suppressed.

2.3 Problems

Preferable doping depth of the impurities in the SiC to configure the power device may be 100 nm or more. However, it has been difficult to diffuse p-type dopant in the SiC to the depth of 100 nm or more.

Embodiments described below may solve the problem by providing a time-domain pulse waveform changing apparatus such as an optical pulse stretcher in the optical path of the pulse laser beam outputted from the laser device. The time-domain pulse waveform changing apparatus may allow the pulse laser beam, with which the surface of the workpiece 43e in the solution is irradiated, to have a long pulse width.

3. Laser Doping Apparatus Including Optical Pulse Stretcher (First Embodiment)

3.1 Configuration

Figure 2:
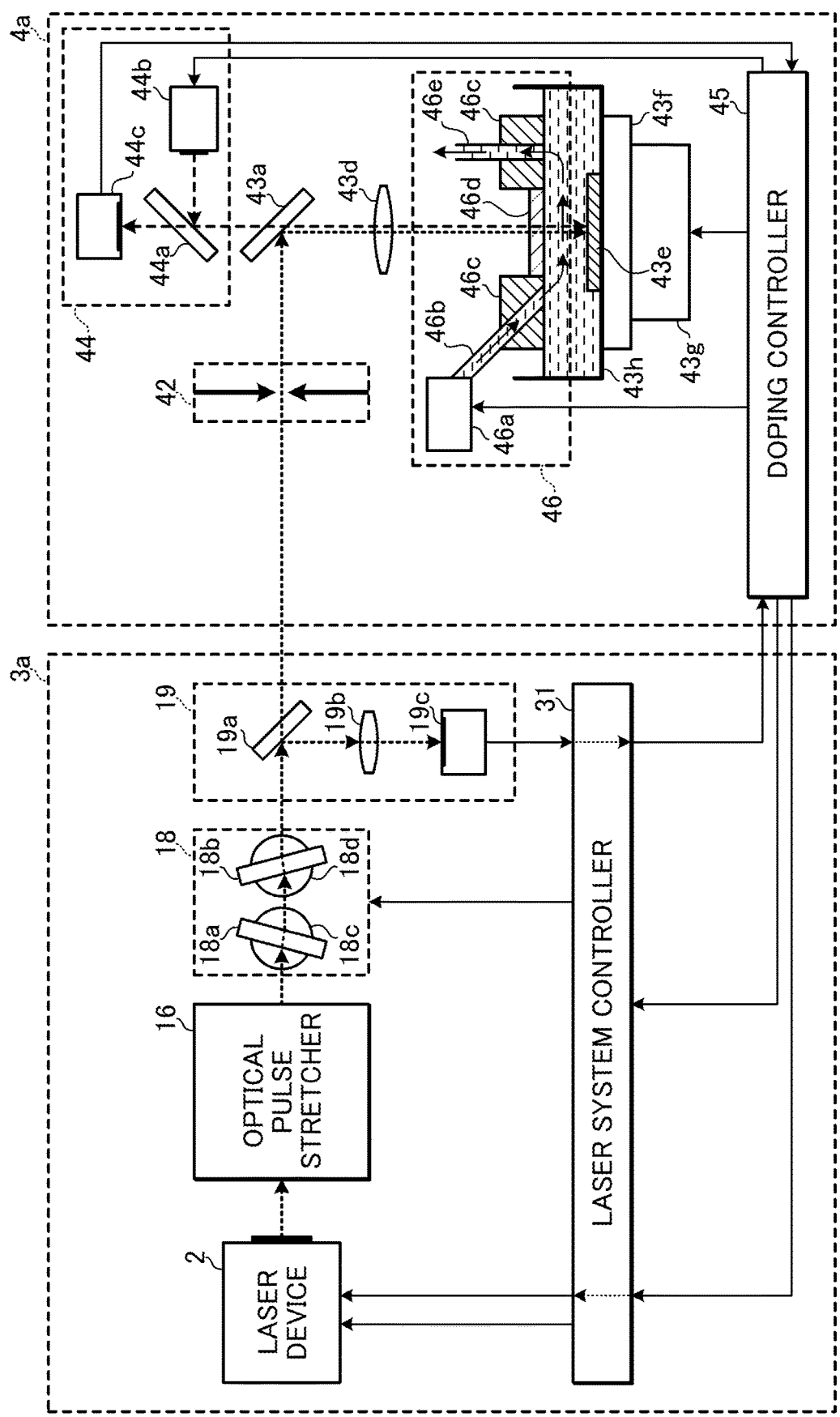
FIG. 2 schematically shows a configuration of a laser doping apparatus of a first embodiment of the present disclosure.

FIG. 2 schematically shows a configuration of a laser doping apparatus of a first embodiment of the present disclosure. In the laser doping apparatus of the first embodiment, a laser system 3a may include the elements of the laser system 3 described above with reference to FIG. 1. The laser system 3a may also include an optical pulse stretcher 16, a pulse waveform measuring unit 19, and a laser system controller 31. In the laser doping apparatus of the first embodiment, a doping device 4a may include the elements of the doping device described above with reference to FIG. 1. The doping device 4a may also include a doping controller 45.

The optical pulse stretcher 16 may be disposed in the optical path of the pulse laser beam between the laser device 2 and the attenuator 18. The optical pulse stretcher 16 may include a beam splitter and delay optics. The optical pulse stretcher 16 may correspond to a time-domain pulse waveform changing apparatus of the present disclosure.

The pulse waveform measuring unit 19 may be disposed in the optical path of the pulse laser beam between the attenuator 18 and the doping device 4a. The pulse waveform measuring unit 19 may include a beam splitter 19a, focusing optics 19b, and an optical sensor 19c. The beam splitter 19a may transmit a part of the pulse laser beam from the attenuator 18 at a high transmittance. The beam splitter 19a may reflect another part of the pulse laser beam toward the focusing optics 19b. The focusing optics 19b may focus the light reflected by the beam splitter 19a on the photosensitive surface of the optical sensor 19c. The optical sensor 19c may be a high-speed photodiode or a biplanar tube.

3.2 Operation

The doping controller 45 may receive data on a picture from the two-dimensional sensor 44c of the display device 44, and control the XYZ stage 43g to improve contrast of the picture. When the XYZ stage 43g is controlled to maximize the contrast of the picture, an image of the surface of the workpiece 43e may be formed on the photosensitive surface of the two-dimensional sensor 44c by the transfer optics 43d. When the XYZ stage 43g is controlled as described above, an image of the slit 42 may be formed on the surface of the workpiece 43e by the transfer optics 43d.

The doping controller 45 may send data on a target value Et of pulse energy to the laser system controller 31 so that the fluence of the pulse laser beam on the workpiece 43e becomes a predetermined value. The target value Et of pulse energy may be one for the pulse laser beam passed through the attenuator 18.

The laser system controller 31 may send, to the laser device 2, a target value EL1 of pulse energy of the pulse laser beam outputted from the laser device 2. Then, the laser system controller 31 may send a signal for controlling transmittance T2 of the attenuator 18 so that the target value Et of pulse energy of the pulse laser beam passed through the attenuator 18 becomes the following value.

$$Et = T1 \cdot T2 \cdot EL1$$

Here, T1 may be a transmittance of the optical pulse stretcher 16.

The doping controller 45 may control the pump 46a such that the solution flows between the window 46d and the irradiated region of the workpiece 43e irradiated with the pulse laser beam.

The doping controller 45 may send an emitting trigger signal through the laser system controller 31 to the laser device 2. Upon receipt of the emitting trigger signal, the laser device 2 may output the pulse laser beam having pulse energy equivalent to the target value EL1 of pulse energy. The outputted pulse laser beam may enter the optical pulse stretcher 16 and be pulse-stretched.

The pulse-stretched pulse laser beam may be attenuated by the attenuator 18 to have a pulse energy equivalent to the target value Et of pulse energy. Then, a part of the pulse laser beam may be reflected by the beam splitter 19a of the pulse waveform measuring unit 19, pass through the focusing optics 19b, and enter the optical sensor 19c.

The laser system controller 31 may receive a signal from the optical sensor 19c and measure the time-domain pulse waveform of the pulse laser beam. The laser system controller 31 may also integrate the time-domain pulse waveform to calculate pulse energy and then determine whether the calculated pulse energy reaches the target value Et of pulse energy. The laser system controller 31 may send data on the measured time-domain pulse waveform to the doping controller 45.

The pulse laser beam passed through the pulse waveform measuring unit 19 may enter the slit 42 of the doping device 4a. The pulse laser beam passed through the slit 42 may be reflected by the high-reflective mirror 43a, transmitted by the transfer optics 43d, the window 46d, and the solution, and be incident on the workpiece 43e. The dopant in the solution may thus be doped in the irradiated region of the workpiece 43e.

3.3 Details of Optical Pulse Stretcher

Figure 3A:
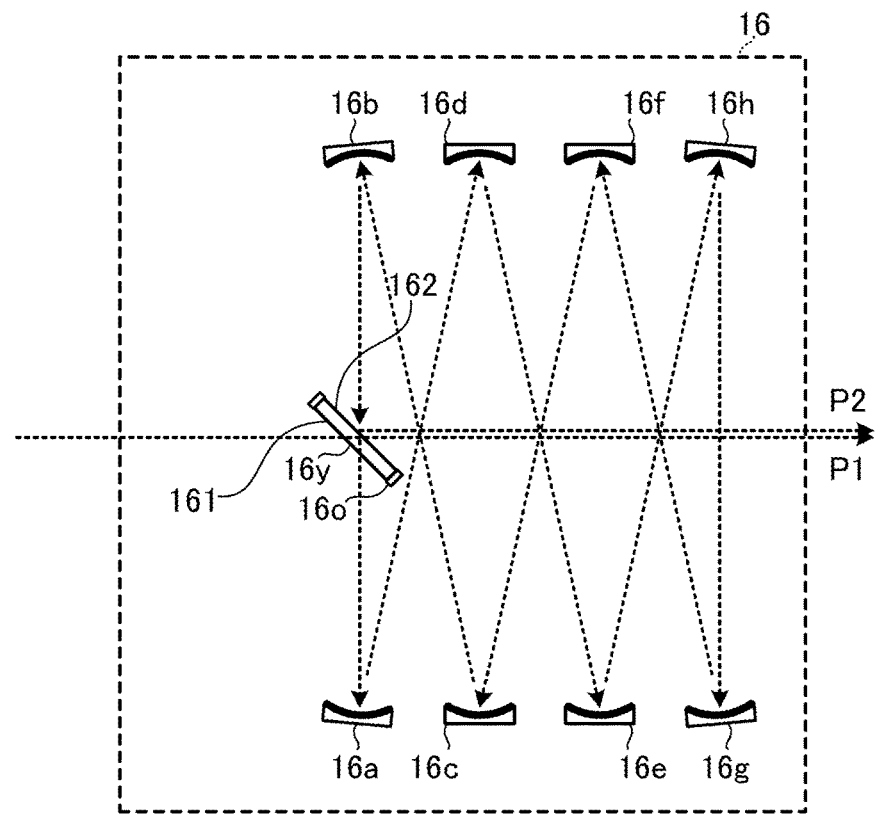
FIG. 3A shows a configuration of an optical pulse stretcher shown in FIG. 2.

FIG. 3A shows a configuration of the optical pulse stretcher shown in FIG. 2. The optical pulse stretcher 16 may include a beam splitter 16y and concave mirrors 16a to 16h.

The beam splitter 16y may include a substrate that transmits the pulse laser beam at a high transmittance. A first surface 161 of this substrate may be coated with a reduced reflection film, and a second surface 162 thereof may be coated with a partial reflection film. The beam splitter 16y may be supported by a holder 16o.

The concave mirrors 16a to 16h may form delay optics. The concave mirrors 16a to 16h may each be a concave mirror having a focal length F (not shown) approximately equal to one another. The focal length F may be equivalent to, for example, the distance from the beam splitter 16y to the concave mirror 16a.

The pulse laser beam entering the beam splitter 16y from the left side of the figure may be transmitted by the first surface 161 at a high transmittance and then be incident on the partial reflection film of the second surface 162. The pulse laser beam incident on the second surface 162 may be branched into first and second optical paths. Specifically, a part of the pulse laser beam incident on the beam splitter 16y from the left side of the figure may be transmitted by the beam splitter 16y to travel the first optical path as a first output pulse P1. Another part of the pulse laser beam incident on the beam splitter 16y from the left side of the figure may be reflected by the beam splitter 16y to travel the second optical path, and then be reflected by the concave mirror 16a.

The pulse laser beam reflected by the concave mirror 16a may be reflected by the concave mirrors 16d, 16e, 16h, 16g, 16f, 16c, and 16b in this order, and then be incident on the beam splitter 16y from the upper side of the figure. A part of the pulse laser beam incident on the beam splitter 16y from the upper side of the figure may be reflected by the beam splitter 16y to travel the first optical path as a second output pulse P2. Another part of the pulse laser beam incident on the beam splitter 16y from the upper side of the figure may be transmitted by the beam splitter 16y to travel the second optical path again.

The first output pulse P1, which is a part of the pulse laser beam incident on the beam splitter 16y from the left side of the figure and transmitted therethrough, and the second output pulse P2, which is a part of the pulse laser beam incident on the beam splitter 16y from the upper side of the figure and reflected thereby, may be outputted from the optical pulse stretcher 16 toward the right side of the figure along approximately the same optical path axes with each other. An optical path length of the delay optical path formed by the concave mirrors 16a to 16h may be equivalent to 16 times as long as the focal length F of each of the concave mirrors 16a to 16h. The delay time of the second output pulse P2 with respect to the first output pulse P1 may be 16F/c, where c represents the speed of light. Further, when the pulse laser beam passed through the delay optical path is again incident on the second surface 162, an erect image of the cross-section of the pulse laser beam at the second surface 162 of the beam splitter 16y may be formed on the second surface 162.

The pulse laser beam incident on the beam splitter 16y from the upper side of the figure and transmitted therethrough may again be reflected by the concave mirror 16a, pass through the same delay optical path, and again be incident on the beam splitter 16y from the upper side of the figure. A part of the pulse laser beam again be incident on the beam splitter 16y from the upper side of the figure may be reflected thereby and outputted from the optical pulse stretcher 16 toward the right side of the figure. By repeating this operation, third and fourth output pulses (not shown) may be outputted along approximately the same optical path axes as those of the first and second output pulses P1 and P2. In this way, the pulse laser beam may be pulse-stretched.

While the eight concave mirrors are shown in FIG. 3A as an example, the present disclosure is not limited to this example. More concave mirrors may be disposed in a similar manner. Alternatively, concave mirrors less than eight, e.g. four concave mirrors, may be disposed.

Figure 3B:
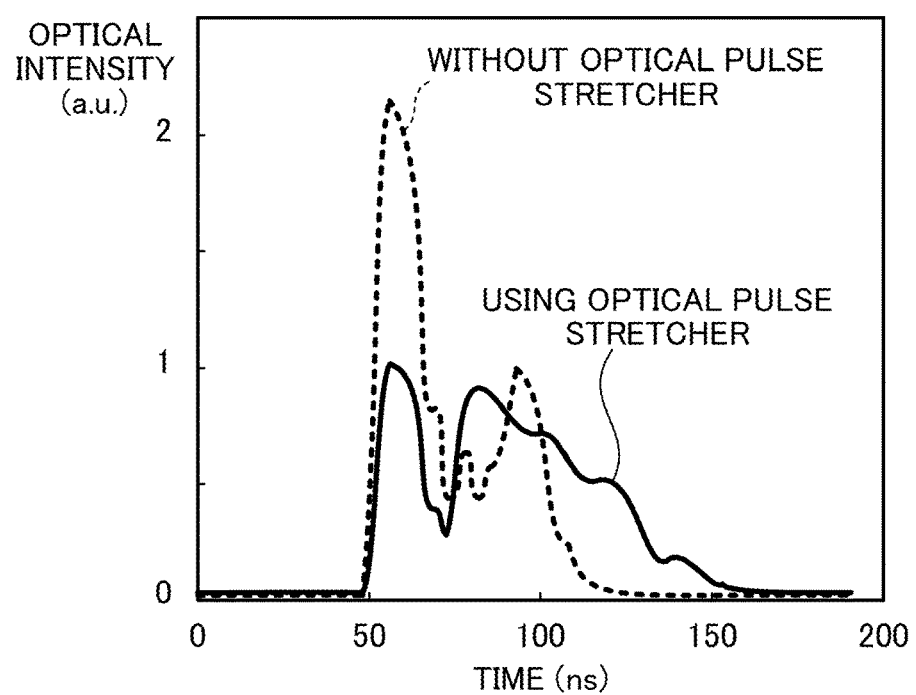
FIG. 3B is a graph showing time-domain pulse waveforms of a pulse laser beam without using an optical pulse stretcher and a pulse laser beam using an optical pulse stretcher.

FIG. 3B is a graph showing time-domain pulse waveforms of a pulse laser beam without using the optical pulse stretcher and a pulse laser beam using the optical pulse stretcher. The optical path length of the delay optical path of the optical pulse stretcher was set to 7 m, and the reflectance of the beam splitter 16y was set to 62%. Without using the optical pulse stretcher, the pulse width $\Delta T_{TIS}$ of the pulse laser beam was approximately 50 ns. When using the optical pulse stretcher, the pulse width $\Delta T_{TIS}$ of the pulse laser beam was approximately 80 ns. Here, the pulse width $\Delta T_{TIS}$ of the pulse laser beam may be calculated by the following formula.

$$\Delta T_{TIS} = [\int I(t) dt]^2 / \int I(t)^2 dt$$

3.4 Effect of First Embodiment

As described above, irradiating the workpiece 43e of the semiconductor material in the dopant-containing solution with the pulse-stretched pulse laser beam may improve doping depth as compared to the case without pulse-stretching.

Figure 4A:
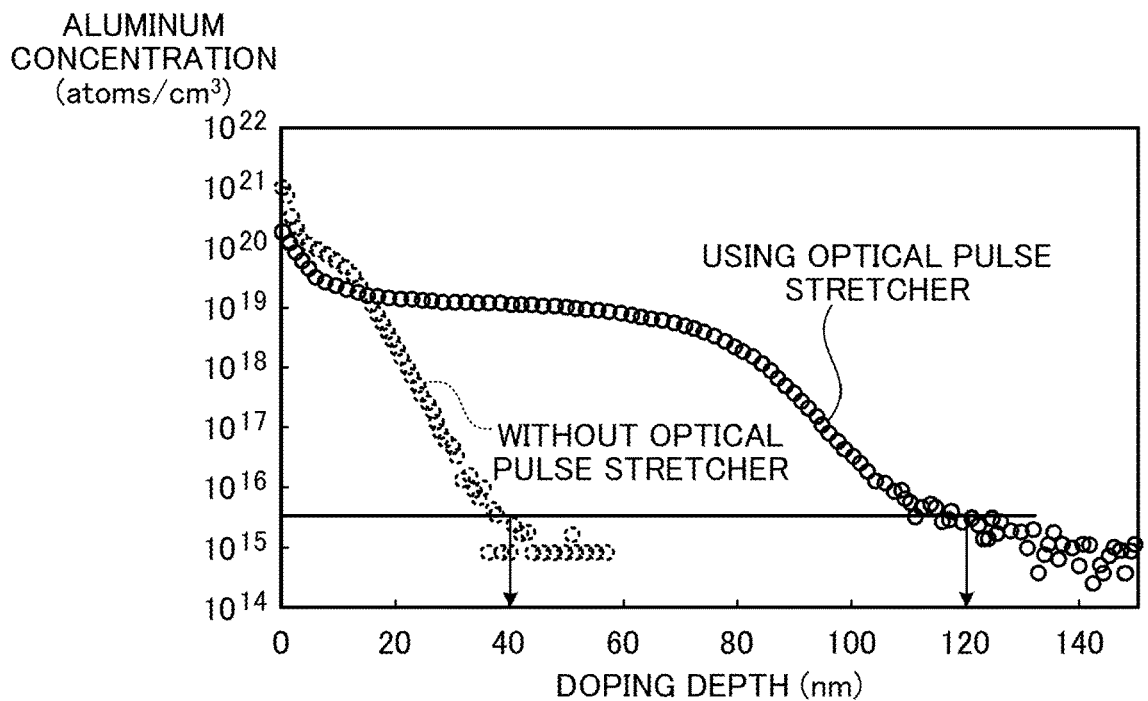
FIG. 4A is a graph showing a relationship between concentration and doping depth of aluminum doped into 4H-SiC.

FIG. 4A is a graph showing a relationship between concentration and doping depth of aluminum doped in the 4H-SiC. Aluminum chloride aqueous solution at the saturated concentration was used as the dopant-containing solution. A KrF excimer laser beam was used as the pulse laser beam. Fluence per one pulse was 4.5 J/cm$^2$, repetition frequency was 100 Hz, and the number of irradiation pulses per one place was 10 pulses. The time-domain pulse waveform and the pulse width are the same as those described above with reference to FIG. 3B for both the case without using the optical pulse stretcher and the case using the optical pulse stretcher.

Measurement of the concentration of the aluminum doped in the 4H-SiC was performed by a secondary ion mass spectrometry (SIMS).

As shown in FIG. 4A, the doping depth of the aluminum was improved from 40 nm to 120 nm by using the optical pulse stretcher to expand the pulse width of the pulse laser beam from 50 ns to 80 ns.

While the 4H-SiC is subjected to aluminum doping in FIG. 4A as an example, the present disclosure is not limited to this example. Doping depth in diamond or GaN may also be improved by expanding the pulse width of the pulse laser beam with which the diamond or GaN is irradiated in the aluminum chloride aqueous solution.

Figure 4B:
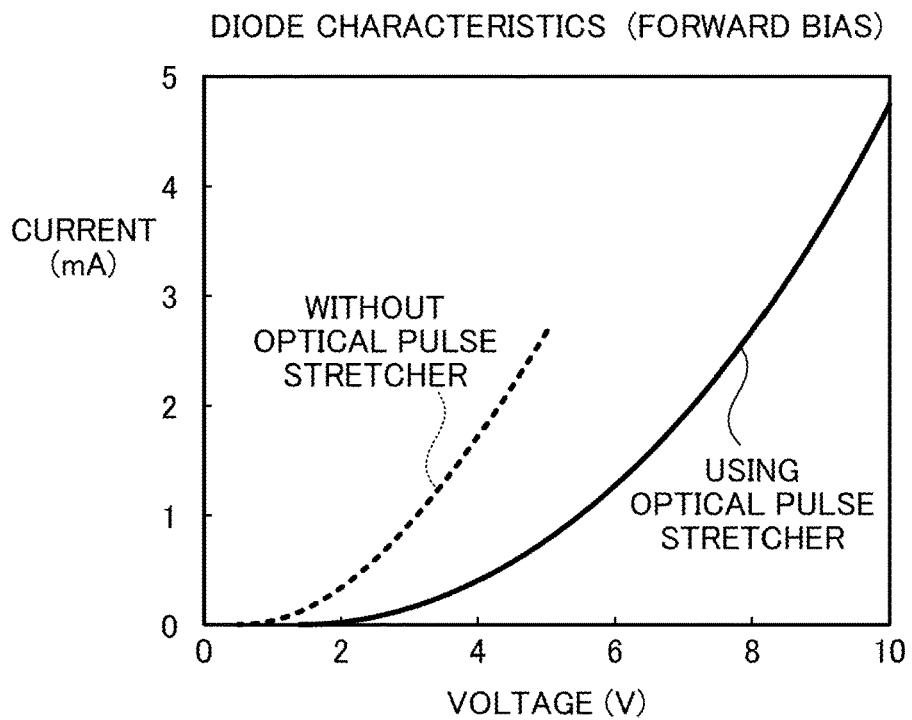
FIG. 4B is a graph showing diode characteristics where a p-type layer is formed by doping aluminum into a part of an n-type 4H-SiC substrate.

FIG. 4B is a graph showing diode characteristics where a p-type layer is formed by doping aluminum in a part of an n-type 4H-SiC substrate. The horizontal axis represents values obtained by subtracting voltages applied to the n-type substrate from voltages applied to the p-type layer. The vertical axis represents electric current. FIG. 4B shows a range where the value of the horizontal axis is 0 or more. In other words, FIG. 4B shows forward bias characteristics.

As shown in FIG. 4B, when the doping was performed without using the optical pulse stretcher, the ON voltage where a forward current begin to flow was approximately 1 V. In contrast, when the doping was performed using the optical pulse stretcher, the ON voltage was approximately 2 V. Generally, the ON voltage at a p-n junction in the SiC may be 2 V to 3 V. The results shown in FIG. 4B may provide evidence of establishing a p-n junction, which may be used as the semiconductor device, by forming the p-type layer using the optical pulse stretcher.

4. Laser Doping Apparatus Where Time-Domain Pulse Waveform is Changed (Second Embodiment)

4.1 Configuration

Figure 5:
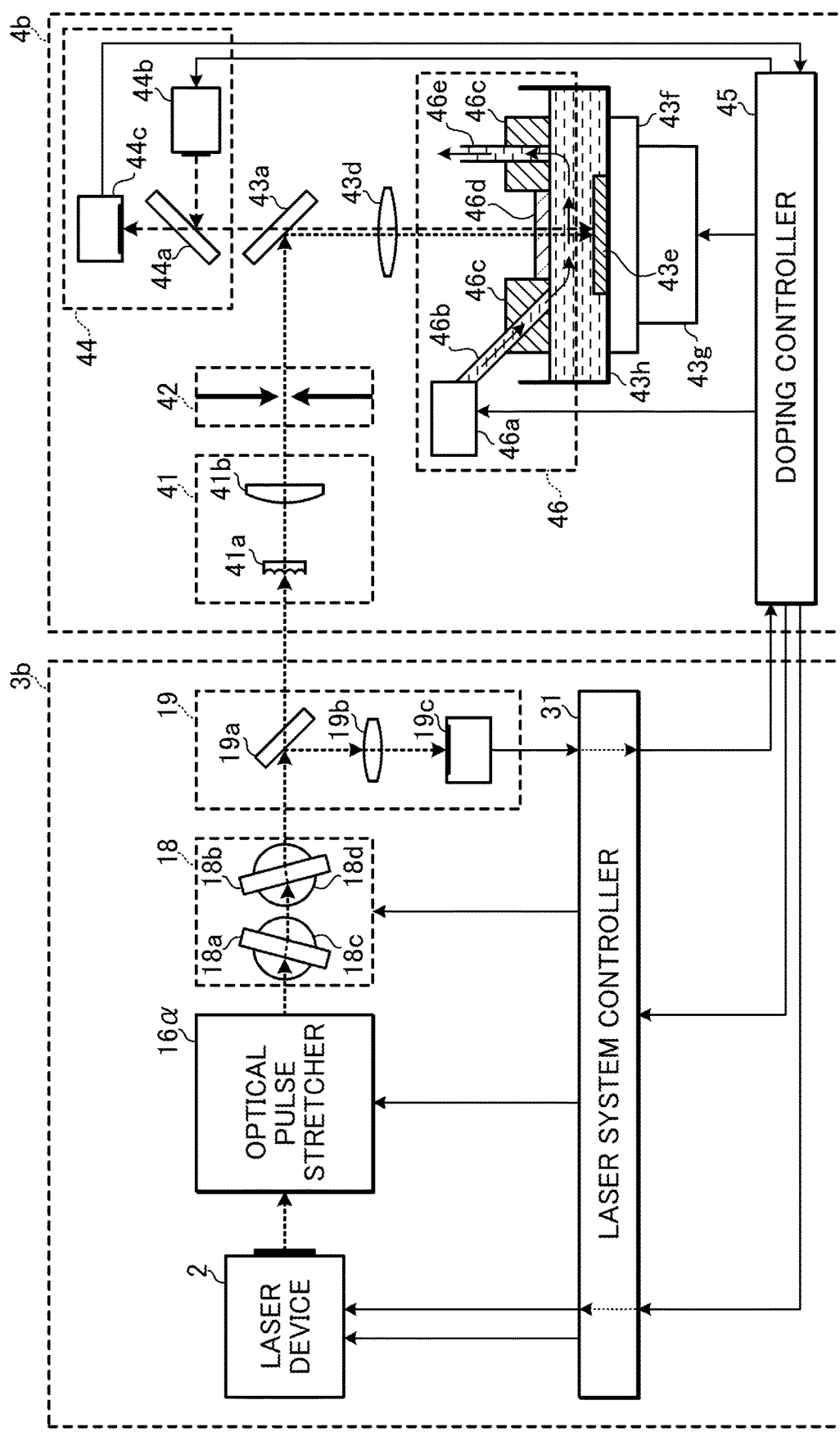
FIG. 5 schematically shows a configuration of a laser doping apparatus of a second embodiment of the present disclosure.

FIG. 5 schematically shows a configuration of a laser doping apparatus of a second embodiment of the present disclosure. In the laser doping apparatus of the second embodiment, a laser system 3b may include an optical pulse stretcher 16α in place of the optical pulse stretcher 16 described above with reference to FIG. 2. Also, in the laser doping apparatus of the second embodiment, a doping device 4b may include the elements of the doping device 4a described above with reference to FIG. 2. The doping device 4b may also include a beam homogenizer 41.

The beam homogenizer 41 may be disposed in the optical path of the pulse laser beam between the pulse waveform measuring unit 19 and the slit 42. The beam homogenizer 41 may include a fly-eye lens 41a and condenser optics 41b. The condenser optics 41b may be disposed such that the rear-side focal point thereof approximately coincides with the position of the slit 42. The fly-eye lens 41a may be disposed such that the position of the focal plane including the front-side focal points of multiple lenses included in the fly-eye lens 41a approximately coincides with the position of the front-side focal plane of the condenser optics 41b.

With the pulse laser beam having entered the doping device 4b, the beam homogenizer 41 may perform Koehler-illumination on the slit 42. This may cause optical intensity distribution of the pulse laser beam to be uniform.

4.2 Details of Optical Pulse Stretcher

Figure 6A:
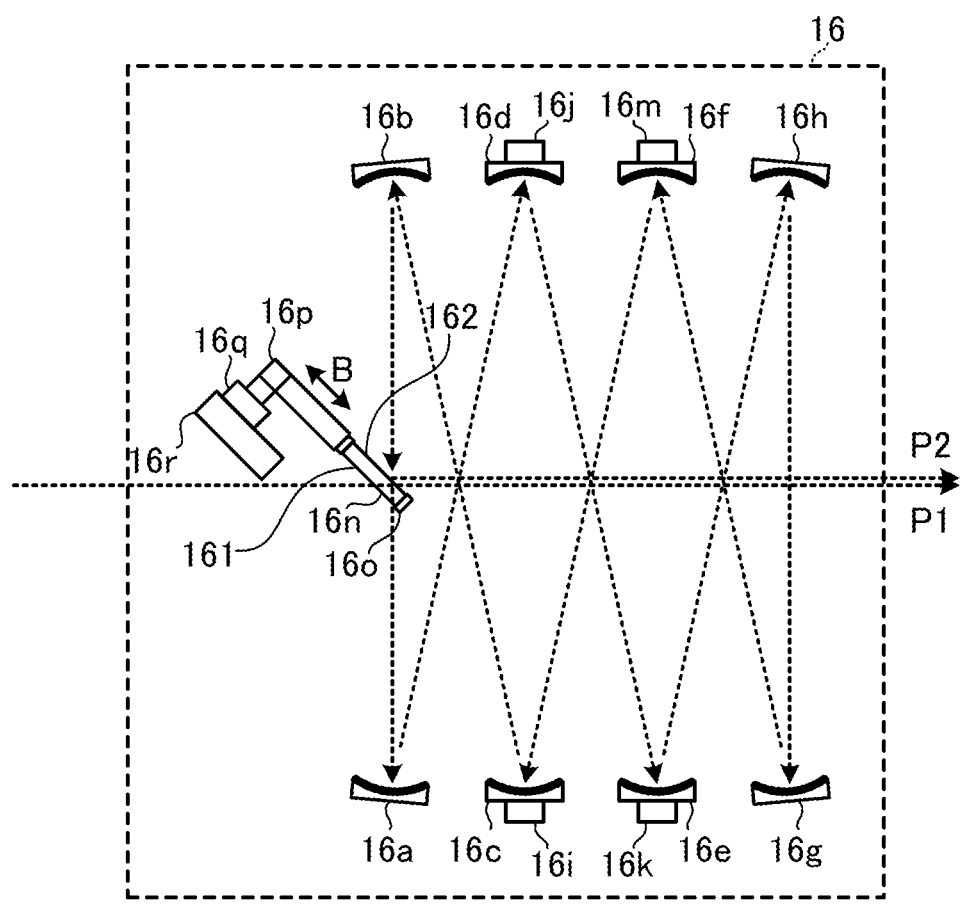
FIG. 6A shows a configuration of an optical pulse stretcher shown in FIG. 5.

FIG. 6A shows a configuration of the optical pulse stretcher shown in FIG. 5. The optical pulse stretcher 16α may include a beam splitter 16n in place of the beam splitter 16y described above with reference to FIG. 3A. Of the concave mirrors 16a to 16h, the concave mirrors 16c, 16d, 16e, and 16f may be supported by rotating stages 16i, 16j, 16k, and 16m, respectively.

A first surface 161 of the beam splitter 16n may be coated with a reduced reflection film, and a second surface 162 thereof may be coated with a partial reflection film having a reflectance distribution in directions of arrows B. The beam splitter 16n may be supported by an arm 16p with a holder 16o. The arm 16p may be supported by a moving table 16q, and the moving table 16q may be supported by a uniaxial stage 16r.

Figure 6B:
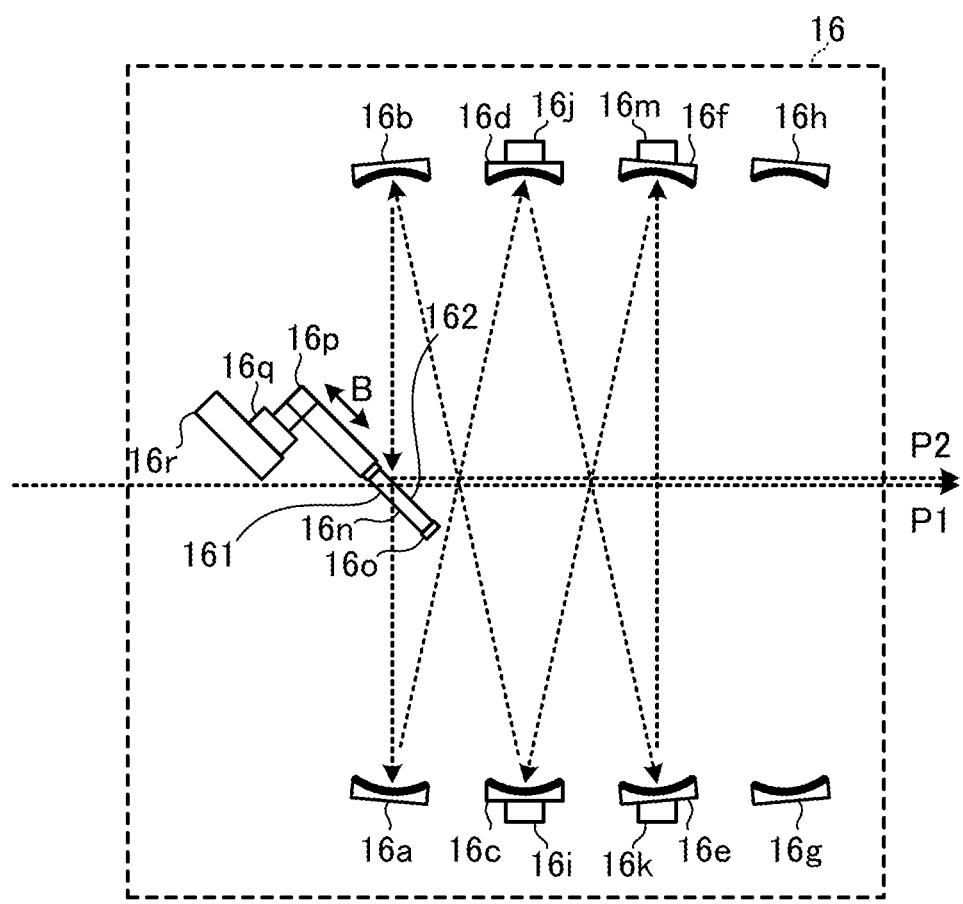
FIG. 6B shows the optical pulse stretcher in which a beam splitter has been moved to a position different from that in FIG. 6A and in which postures of concave mirrors are different from those in FIG. 6A.
Figure 6C:
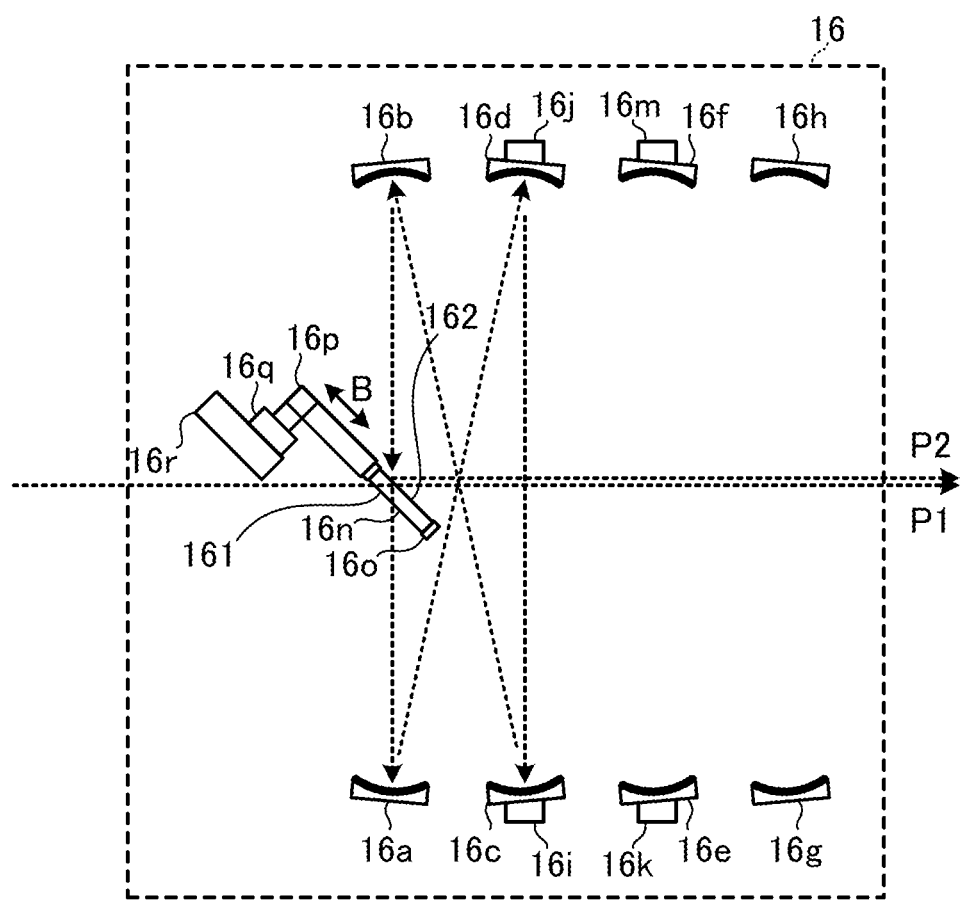
FIG. 6C shows the optical pulse stretcher in which postures of the concave mirrors are different from those in FIG. 6B.
Figure 6D:
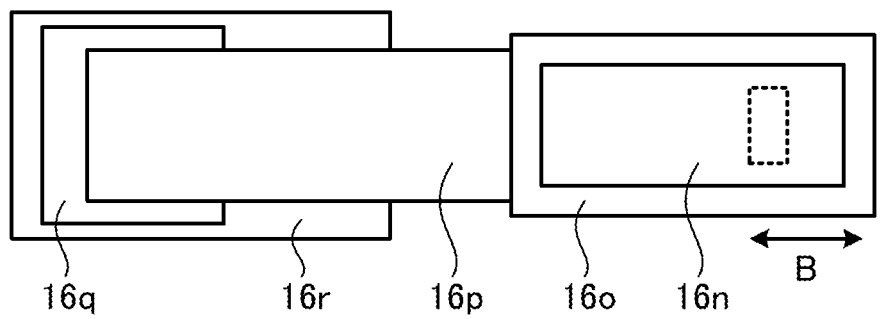
FIG. 6D shows the beam splitter, a holder, an arm, a moving table, and a uniaxial stage as viewed in a direction perpendicular to the reflection surface of the beam splitter.
Figure 6E:
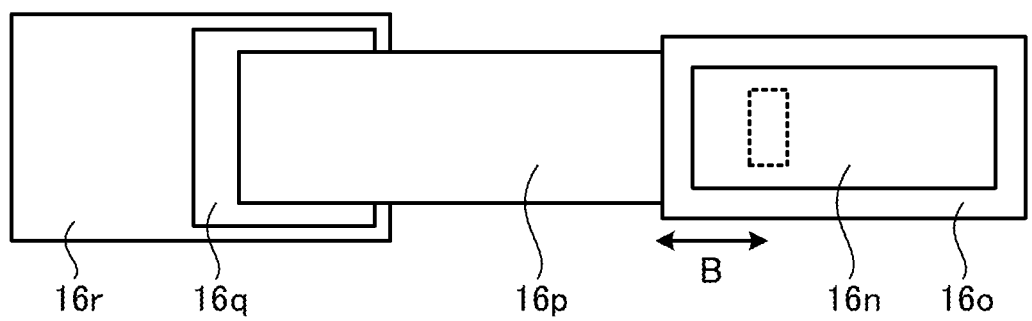
FIG. 6E shows the beam splitter, the holder, the arm, the moving table, and the uniaxial stage in which the beam splitter has been moved to a position different from that in FIG. 6D.

FIGS. 6D and 6E show the beam splitter 16n, the holder 16o, the arm 16p, the moving table 16q, and the uniaxial stage 16r as viewed in a direction perpendicular to the reflection surface of the beam splitter 16n. FIGS. 6B, 6C, and 6E show a state in which the beam splitter 16n and its periphery have been moved to positions different from those in FIGS. 6A and 6D. The uniaxial stage 16r may be configured such that the beam splitter 16n, the holder 16o, the arm 16p, and the moving table 16q move in the directions of the arrows B. The uniaxial stage 16r may be controlled by the laser system controller 31 (see FIG. 5). Thus, the beam splitter 16n may be capable of moving in the directions of the arrows B while maintaining the incident angle of the pulse laser beam.

Referring back to FIG. 6A, the rotating stages 16i, 16j, 16k, and 16m may be capable of rotating the concave mirrors 16c, 16d, 16e, and 16f, respectively, in a plane parallel to the surface of the figure and controlling the postures thereof. The rotating stages 16i, 16j, 16k, and 16m may be controlled by the laser system controller 31.

When the postures of the concave mirrors 16c, 16d, 16e, and 16f are in a state shown in FIG. 6A, the optical path of the pulse laser beam entered the optical pulse stretcher 16α may be similar to that described above with reference to FIG. 3A.

FIG. 6B shows the optical pulse stretcher 16α in which the postures of the concave mirrors 16c, 16d, 16e, and 16f are different from those in FIG. 6A. When the postures of the concave mirrors 16c, 16d, 16e, and 16f are in the state shown in FIG. 6B, the pulse laser beam reflected by the concave mirror 16a may be reflected by the concave mirrors 16d, 16e, 16f, 16c, and 16b in this order. That is, the concave mirrors 16h and 16g may be skipped. In this case, an optical path length of the delay optical path may be equivalent to about 12 times as long as the focal length F of each of the concave mirrors 16a to 16h.

FIG. 6C shows the optical pulse stretcher 16α in which the postures of the concave mirrors 16c, 16d, 16e, and 16f are different from those in FIGS. 6A and 6B. When the postures of the concave mirrors 16c, 16d, 16e, and 16f are in the state shown in FIG. 6C, the pulse laser beam reflected by the concave mirror 16a may be reflected by the concave mirrors 16d, 16c, and 16b in this order. That is, the concave mirrors 16e, 16h, 16g, and 16f may be skipped. In this case, the optical path length of the delay optical path may be equivalent to about 8 times as long as the focal length F of each of the concave mirrors 16a to 16h.

As seen above, the optical path length of the delay optical path may be changed to 8F, 12F, and 16F in accordance with the postures of the concave mirrors 16c, 16d, 16e, and 16f. In any of these cases, a transfer image of a cross-section of the pulse laser beam incident on the second surface 162 of the beam splitter 16n may be formed on the second surface 162 of the beam splitter 16n. A change in optical path length of the delay optical path may cause a change in delay time of the second output pulse P2 or the third or fourth output pulse with respect to the first output pulse P1. Thus, the time-domain pulse waveform of the pulse laser beam outputted from the optical pulse stretcher 16α may be changed.

Moving the position of the beam splitter 16n in the directions of the arrows B using the uniaxial stage 16r may cause a change in reflectance of the beam splitter 16n reflecting the pulse laser beam. The change in reflectance of the beam splitter 16n reflecting the pulse laser beam may cause a change in optical intensity ratio of the second output pulse P2 or the third or fourth output pulse to the first output pulse P1. Thus, the time-domain pulse waveform of the pulse laser beam outputted from the optical pulse stretcher 16α may be changed.

As seen above, the changes in the reflectance of the beam splitter and in the optical path length of the delay optical path in the optical pulse stretcher 16α may achieve change in time interval between each adjacent two pulses of the first to fourth output pulses or change in optical intensity ratio of the second to fourth output pulses to the first output pulse.

The other aspects may be similar to those of the laser doping apparatus described above with reference to FIGS. 2 and 3A.

4.3 Process of Doping Controller 4.3.1 Main Flow

Figure 7:
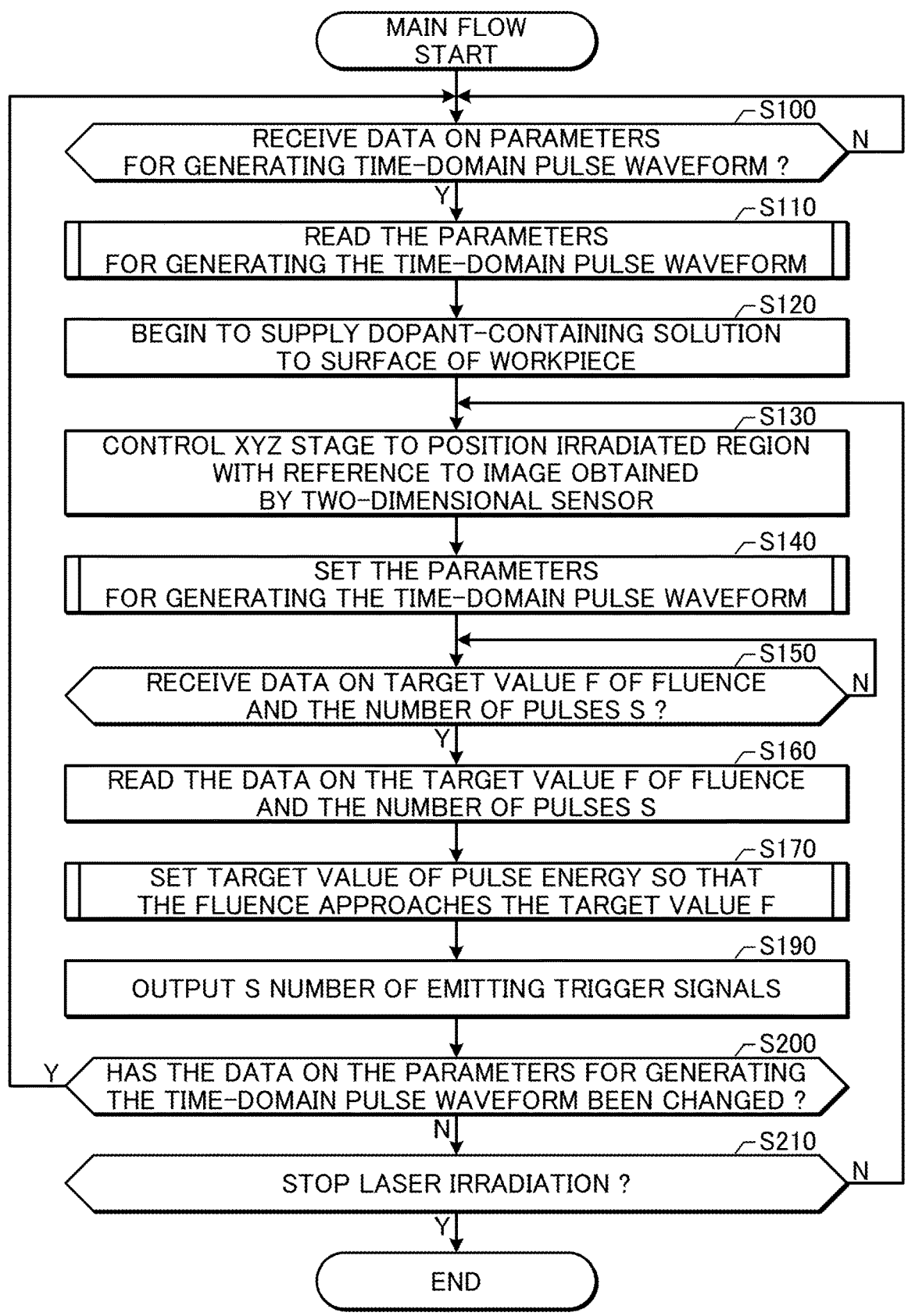
FIG. 7 is a flowchart showing a process of doping control performed by a doping controller shown in FIG. 5.

FIG. 7 is a flowchart showing a process of doping control performed by the doping controller shown in FIG. 5. In the following process, the doping controller 45 may perform doping using the pulse laser beam having a desired time-domain pulse waveform.

First, in S100, the doping controller 45 may determine whether the doping controller 45 has received data on parameters for generating the time-domain pulse waveform. The data on the parameters for generating the time-domain pulse waveform may be that inputted by an operator or received via network from an unillustrated computer system. The parameters for generating the time-domain pulse waveform may be parameters necessary for generating a time-domain pulse waveform. In this embodiment, the parameters may include a target value of reflectance of the beam splitter 16n, and a target value of optical path length of the delay optical path of the optical pulse stretcher 16α.

If the doping controller 45 has received the data on the parameters for generating the time-domain pulse waveform, the doping controller 45 may proceed to S110. If the doping controller 45 has not received the data on the parameters for generating the time-domain pulse waveform, the doping controller 45 may wait until receiving the data on the parameters for generating the time-domain pulse waveform.

If the doping controller 45 has received the data on the parameters for generating the time-domain pulse waveform (S100: YES), the doping controller 45 may read, in S110, the parameters for generating the time-domain pulse waveform. Details of this process will be described later with reference to FIG. 8A.

Then, in S120, the doping controller 45 may control the pump 46a (see FIG. 5) to begin to supply the dopant-containing solution to the surface of the workpiece.

Then, in S130, the doping controller 45 may control the XYZ stage 43g to position the irradiated region with reference to the image obtained by the two-dimensional sensor 44c (see FIG. 5).

Then, in S140, the doping controller 45 may set the received parameters for generating the time-domain pulse waveform for the laser system 3b. In other words, the doping controller 45 may send the target value of optical path length of the delay optical path of the optical pulse stretcher 16α, and the target value of reflectance of the beam splitter 16n to the laser system controller 31. Details of this process will be described later with reference to FIG. 8B.

Then, in S150, the doping controller 45 may determine whether the doping controller 45 has received data on a target value F of fluence and the number of pulses S. The data on the target value F of fluence and the number of pulses S may be that, for example, inputted by an operator, or received via a network from an unillustrated computer system.

If the doping controller 45 has received the data on the target value F of fluence and the number of pulses S, the doping controller 45 may proceed to S160. If the doping controller 45 has not received the data on the target value F of fluence and the number of pulses S, the doping controller 45 may wait until receiving the data on the target value F of fluence and the number of pulses S.

If the doping controller 45 has received the data on the target value F of fluence and the number of pulses S (S150: YES), the doping controller 45 may read, in S160, the data on the target value F of fluence and the number of pulses S.

Then, in S170, the doping controller 45 may set a target value of pulse energy so that the fluence approaches the target value F. The doping controller 45 may send the data on the target value of pulse energy to the laser system controller 31. Details of this process will be described later with reference to FIG. 8C.

Then, in S190, the doping controller 45 may output S number of emitting trigger signals to the laser system controller 31. The laser system 3b may thus generate the pulse laser beam including S number of pulses. The pulse laser beam may be incident on the workpiece 43e.

Then, in S200, the doping controller 45 may determine whether the data on the parameters for generating the time-domain pulse waveform has been changed. If the data on the parameters for generating the time-domain pulse waveform has been changed (S200: YES), the doping controller 45 may return to the above-described process of S100 to receive data on the parameters for generating the time-domain pulse waveform.

If the data on the parameters for generating the time-domain pulse waveform has not been changed (S200: NO), the doping controller 45 may proceed to S210. In S210, the doping controller 45 may determine whether the laser irradiation should be stopped. If the laser irradiation should not be stopped (S210: NO), the doping controller 45 may return to the above-described process of S130 to control the XYZ stage 43g and output the emitting trigger signals. If the laser irradiation should be stopped (S210: YES), the doping controller 45 may end the process of this flowchart.

4.3.2 Details of S110

Figure 8A:
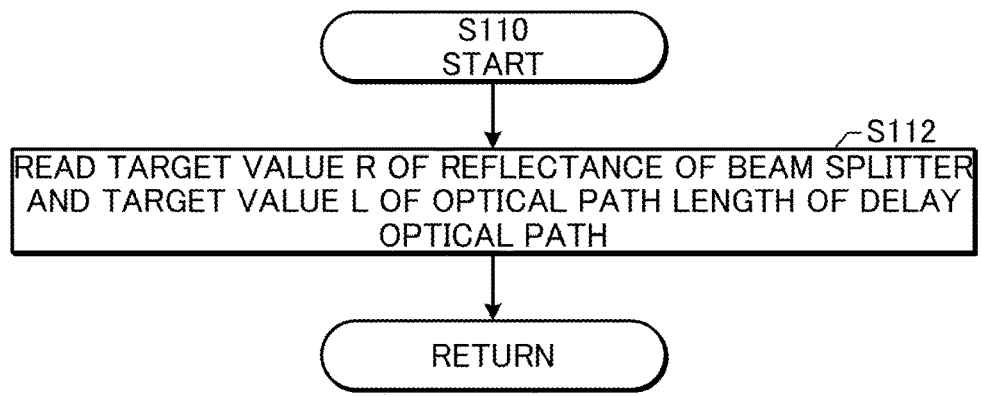
FIG. 8A is a flowchart showing details of a process shown in FIG. 7 to read parameters for generating a time-domain pulse waveform.

FIG. 8A is a flowchart showing details of the process shown in FIG. 7 to read the parameters for generating the time-domain pulse waveform. The doping controller 45 may perform the process shown in FIG. 8A as a subroutine of S110 shown in FIG. 7.

In S112, the doping controller 45 may read a target value R of reflectance of the beam splitter 16n and a target value L of optical path length of the delay optical path.

After S112, the doping controller 45 may end the process of this flowchart to return to the process shown in FIG. 7.

4.3.3 Details of S140

Figure 8B:
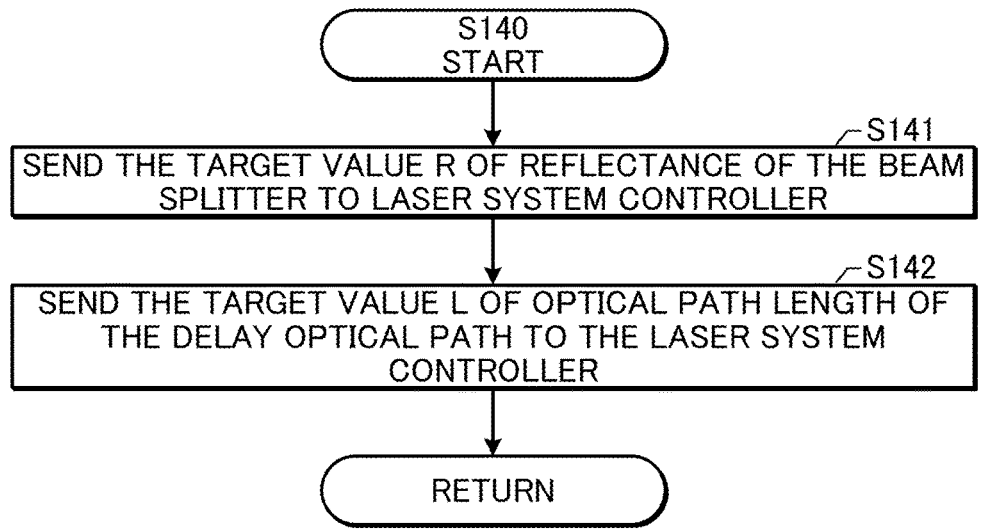
FIG. 8B is a flowchart showing details of a process shown in FIG. 7 to set parameters for generating the time-domain pulse waveform.

FIG. 8B is a flowchart showing details of the process shown in FIG. 7 to set the parameters for generating the time-domain pulse waveform. The doping controller 45 may perform the process shown in FIG. 8B as a subroutine of S140 shown in FIG. 7.

First, in S141, the doping controller 45 may send the target value R of reflectance of the beam splitter 16n to the laser system controller 31. The laser system controller 31 may then control the uniaxial stage 16r to move the beam splitter 16n so that the reflectance of the beam splitter 16n approaches the target value R.

Then, in S142, the doping controller 45 may send the target value L of optical path length of the delay optical path to the laser system controller 31. The laser system controller 31 may then control the rotating stages 16i, 16j, 16k, and 16m to rotate the respective concave mirrors 16c, 16d, 16e, and 16f of the optical pulse stretcher 16α so that the optical path length of the delay optical path of the optical pulse stretcher 16α approaches the target value L.

After S142, the doping controller 45 may end the process of this flowchart to return to the process shown in FIG. 7.

4.3.4 Details of S170

Figure 8C:
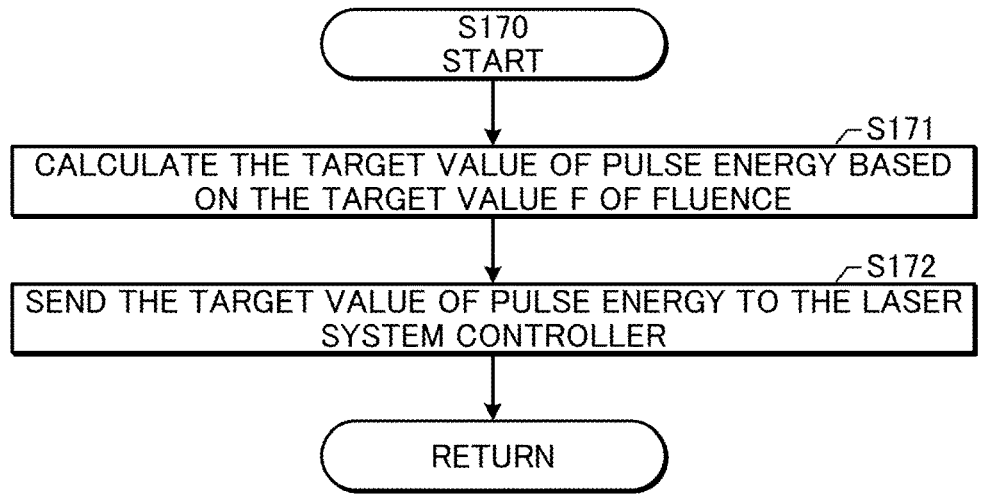
FIG. 8C is a flowchart showing details of a process shown in FIG. 7 to set a target value of pulse energy.

FIG. 8C is a flowchart showing details of the process shown in FIG. 7 to set the target value of pulse energy. The doping controller 45 may perform the process shown in FIG. 8C as a subroutine of S170 shown in FIG. 7.

First, in S171, the doping controller 45 may calculate the target value Et of pulse energy based on the received target value F of fluence. The target value Et of pulse energy may be calculated as follows.

$$Et = F \cdot A / Tt$$

Here, A represents an area of the image of the slit 42 formed on the workpiece 43e. Tt represents a transmittance of the optical path of the pulse laser beam between the pulse waveform measuring unit 19 in the laser system 3b and the irradiated region of the workpiece 43e.

Then, in S172, the doping controller 45 may send the target value Et of pulse energy to the laser system controller 31. The laser system controller 31 may then calculate the target value EL1 of pulse energy of the pulse laser beam to be outputted from the laser device 2, and then control the laser device 2 based on the calculation results. Further, the laser system controller 31 may calculate the target value of the transmittance T2 of the attenuator 18 based on the target value Et of pulse energy. This target value may be calculated such that the following formula for the transmittance T2 of the attenuator 18 is satisfied.

$$T2 = Et / (T1 \cdot EL1)$$

Here, T1 represents a transmittance of the optical pulse stretcher 16α. The laser system controller 31 may then control the attenuator 18 based on the calculation result of the target value of the transmittance T2 of the attenuator 18. The pulse energy of the pulse laser beam outputted from the laser system 3b may thus approach the target value Et of pulse energy.

After S172, the doping controller 45 may end the process of this flowchart to return to the process shown in FIG. 7.

4.4 Modified Example of Process of Doping Controller 4.4.1 Main Flow

Figure 9:
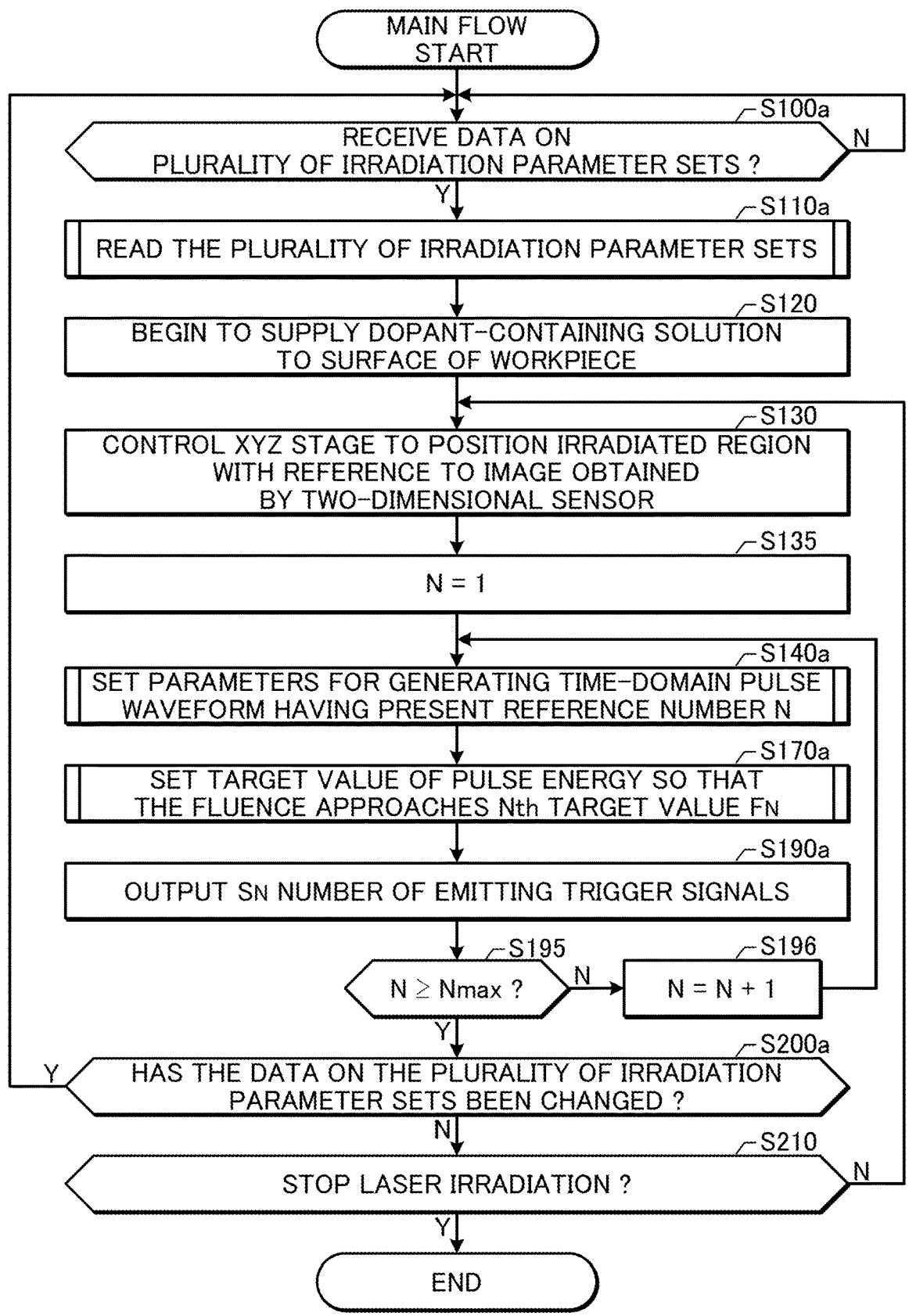
FIG. 9 is a flowchart showing a modified example of the process of doping control performed by the doping controller shown in FIG. 5.

FIG. 9 is a flowchart showing a modified example of the process of doping control performed by the doping controller shown in FIG. 5. In the following process, the doping controller 45 may perform doping on a plurality of irradiation conditions.

In S100a and S110a, the doping controller 45 may receive and read a plurality of irradiation parameter sets. The doping controller 45 may receive and read nmax number of combinations of the irradiation parameter sets. Each of the irradiation parameter sets may include the parameters for generating the time-domain pulse waveform. Each of the irradiation parameter sets may also include a target value of fluence and the number of pulses.

Details of the process of S110a will be described later with reference to FIG. 10A. In the other aspects, the processes of S100a and S110a may be similar to those of S100 and S110 described above with reference to FIG. 7. The next processes of S120 and S130 may be similar to those described above with reference to FIG. 7.

Then, in S135, the doping controller 45 may set the value of the reference number N to 1.

Then, in S140a, the doping controller 45 may set the parameters for generating the time-domain pulse waveform having the present reference number N for the laser system 3b. Specifically, the doping controller 45 may send the Nth target value $L_N$ of optical path length of the delay optical path of the optical pulse stretcher 16α and the Nth target value $R_N$ of reflectance of the beam splitter 16n to the laser system controller 31. Details of this process will be described later with reference to FIG. 10B.

Then, in S170a, the doping controller 45 may set the target value of pulse energy such that the fluence approaches the Nth target value $F_N$. The doping controller 45 may send the data on the target value of pulse energy to the laser system controller 31. Details of this process will be described later with reference to FIG. 10C.

Then, in S190a, the doping controller 45 may output $S_N$ number of emitting trigger signals to the laser system controller 31. The laser system 3b may thus generate pulse laser beams including $S_N$ number of pulses. These pulses of the pulse laser beam may be incident on the surface of the workpiece 43e.

Then, in S195, the doping controller 45 may determine whether the value of the reference number N is nmax or more.

If the value of the reference number N is not nmax or more (S195: NO), the doping controller 45 may, in S196, update the value of the reference number N by incrementing the value of the reference number N by 1. After S196, the doping controller 45 may return to the above-described process of S140a.

If the value of the reference number N is nmax or more (S195: YES), the emitting trigger signals have been outputted for all irradiation parameter sets from reference number N=1 to reference number N=nmax. The doping controller 45 may thus proceed to S200a.

Then, in S200a, the doping controller 45 may determine whether the data on the irradiation parameter sets has been changed. If the data on the irradiation parameter sets has been changed (S200a: YES), the doping controller 45 may return to the above-described process of S100a to receive again the data on the irradiation parameter sets.

If the data on the irradiation parameter sets has not been changed (S200a: NO), the doping controller 45 may proceed to S210.

S210 and subsequent processes may be similar to those described above with reference to FIG. 7.

4.4.2 Details of S110a

Figure 10A:
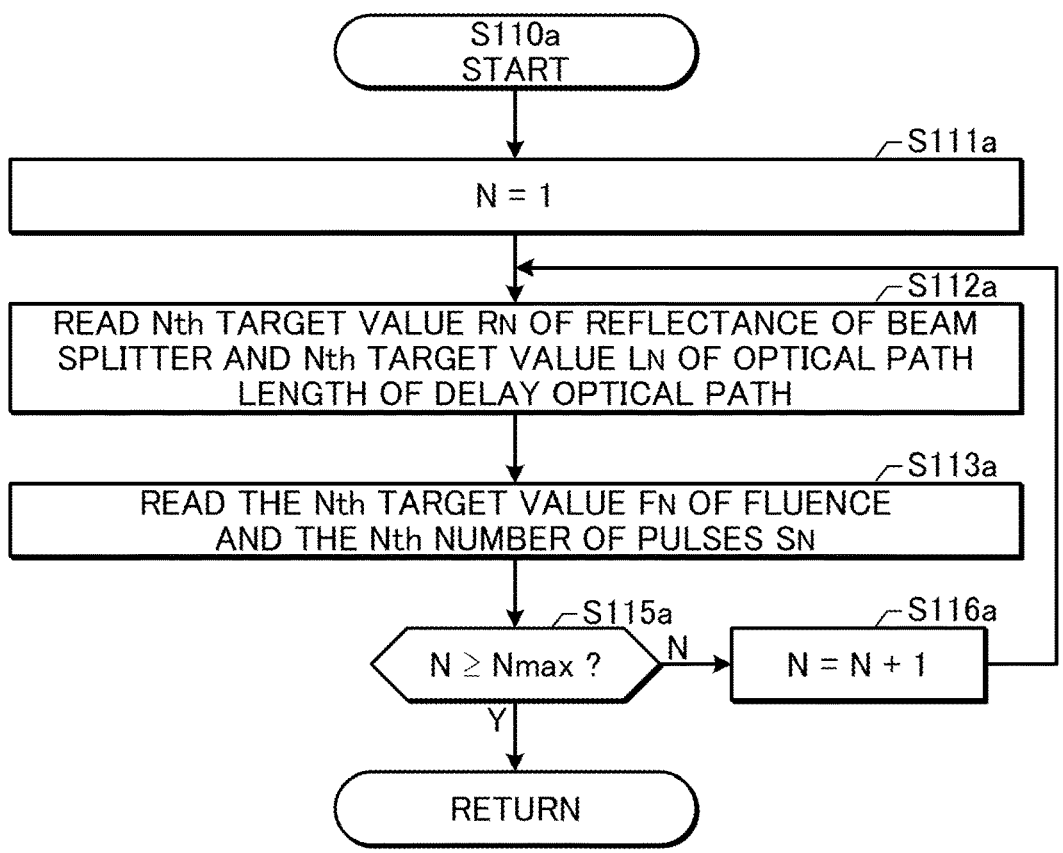
FIG. 10A is a flowchart showing details of a process shown in FIG. 9 to read irradiation parameter sets.

FIG. 10A is a flowchart showing details of the process shown in FIG. 9 to read the irradiation parameter sets. The doping controller 45 may perform the process shown in FIG. 10A as a subroutine of S110a shown in FIG. 9.

First, in S111a, the doping controller 45 may set the value of the reference number N to 1.

Then, in S112a, the doping controller 45 may read the Nth target value $R_N$ of reflectance of the beam splitter 16n and the Nth target value $L_N$ of optical path length of the delay optical path of the optical pulse stretcher 16α.

Then, in S113a, the doping controller 45 may read the Nth target value $F_N$ of fluence and the Nth number of pulses $S_N$.

Then, in S115a, the doping controller 45 may determine whether the value of the reference number N is nmax or more.

If the value of the reference number N is not nmax or more (S115a: NO), the doping controller 45 may update, in S116a, the value of the reference number N by incrementing the value of the reference number N by 1. After S116a, the doping controller 45 may return to the above-described process of S112a.

If the value of the reference number N is nmax or more (S115a: YES), the doping controller 45 has received all irradiation parameter sets from reference number N=1 to reference number N=nmax. The doping controller 45 may thus end the process of this flowchart to return to the process shown in FIG. 9.

The present disclosure is not limited to perform the process in FIG. 10A. The doping controller 45 may read the nmax number of irradiation parameter sets at one time in table data format.

4.4.3 Details of S140a

Figure 10B:
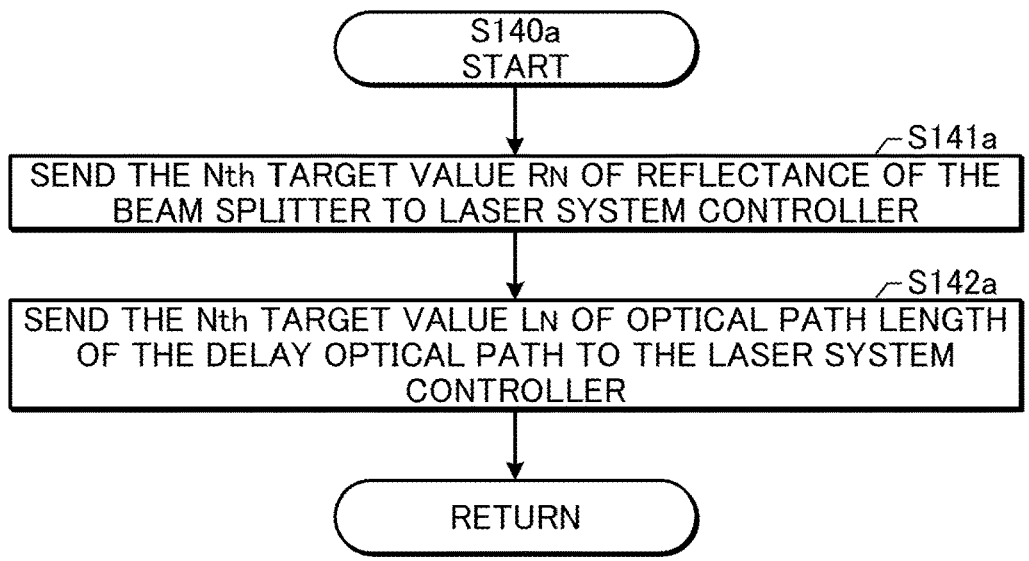
FIG. 10B is a flowchart showing details of a process shown in FIG. 9 to set parameters for generating the time-domain pulse waveform.

FIG. 10B is a flowchart showing details of the process shown in FIG. 9 to set the parameters for generating the time-domain pulse waveform. The doping controller 45 may perform the process shown in FIG. 10B as a subroutine of S140a shown in FIG. 9.

First, in S141a, the doping controller 45 may send the Nth target value $R_N$ of reflectance of the beam splitter 16n to the laser system controller 31. The laser system controller 31 may thus control the uniaxial stage 16r to move the beam splitter 16n such that the reflectance of the beam splitter 16n approaches the Nth target value $R_N$.

Then, in S142a, the doping controller 45 may send the Nth target value $L_N$ of optical path length of the delay optical path to the laser system controller 31. The laser system controller 31 may thus control the rotating stages 16i, 16j, 16k, and 16m to rotate the respective concave mirrors 16c, 16d, 16e, and 16f of the optical pulse stretcher 16α so that the optical path length of the delay optical path of the optical pulse stretcher 16a approaches the Nth target value $L_N$.

After S142a, the doping controller 45 may end the process of this flowchart to return to the process shown in FIG. 9.

4.4.4 Details of S170a

Figure 10C:
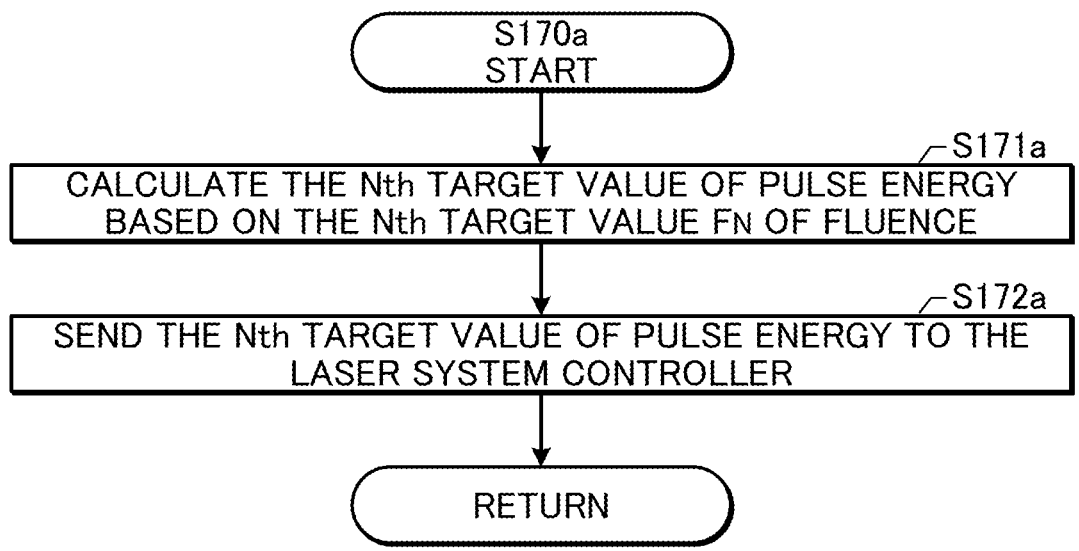
FIG. 10C is a flowchart showing details of a process shown in FIG. 9 to set a target value of pulse energy.

FIG. 10C is a flowchart showing details of the process shown in FIG. 9 to set the target value of pulse energy. The doping controller 45 may perform the process shown in FIG. 10C as a subroutine of S170a shown in FIG. 9.

First, in S171a, the doping controller 45 may calculate the Nth target value Et of pulse energy based on the received Nth target value $F_N$ of fluence. The Nth target value Et of pulse energy may be calculated similarly to that described above with reference to FIG. 8C.

Then, in S172a, the doping controller 45 may send the Nth target value Et of pulse energy to the laser system controller 31. The laser system controller 31 may receive the Nth target value Et of pulse energy and operate similarly to that described above with reference to FIG. 8C.

After S172a, the doping controller 45 may end the process of this flowchart to return to the process shown in FIG. 9.

Figure 11:
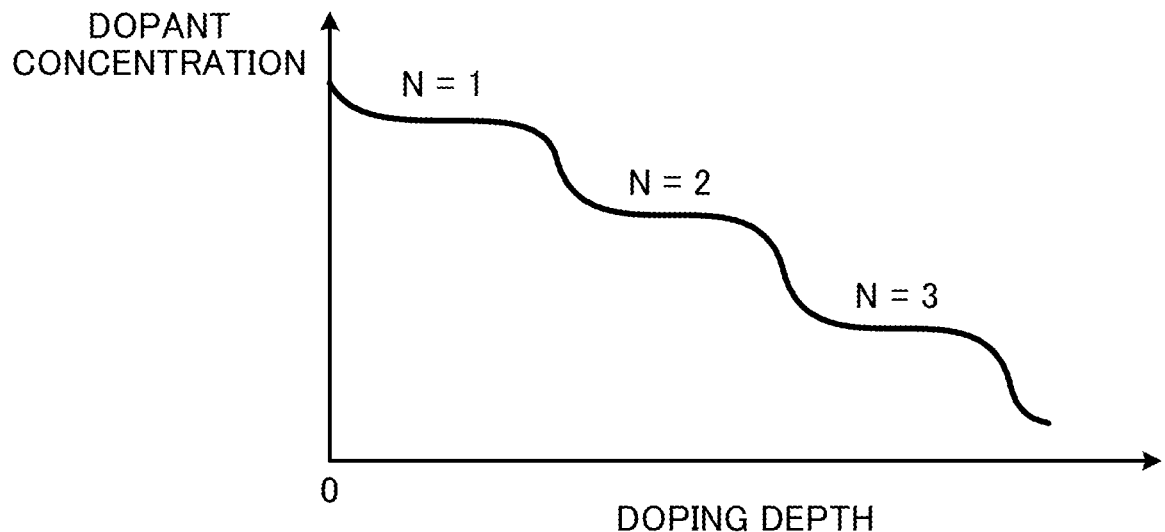
FIG. 11 shows an example of a distribution of dopant concentration in a direction of depth of a semiconductor made in the modified example shown in FIG. 9 and FIGS. 10A to 10C.

FIG. 11 shows an example of a distribution of dopant concentration in a direction of depth of the semiconductor made in the modified example shown in FIG. 9 and FIGS. 10A to 10C. In the modified example, the same irradiated region may be irradiated with pulse laser beams having different time-domain pulse waveforms, different fluence values, and different values of the number of pulses. Different dopant concentrations may be made in the direction of depth of the semiconductor. For example, an irradiation parameter set of reference number N=1 may be set such that the doping depth is small and the dopant concentration is high. In contrast, an irradiation parameter set of reference number N=3 may be set such that the doping depth is large and the dopant concentration is low. An irradiation parameter set of reference number N=2 may be set such that the doping depth and the dopant concentration are in between those for the irradiation parameter sets of reference number N=1 and reference number N=3. The doping depth may be mainly controlled by controlling the pulse width. The dopant concentration may be mainly controlled by controlling the fluence or the number of pulses.

5. Laser Doping Apparatus Where Form and Size of Irradiated Region are Changed (Third Embodiment)

5.1 Configuration

Figure 12:
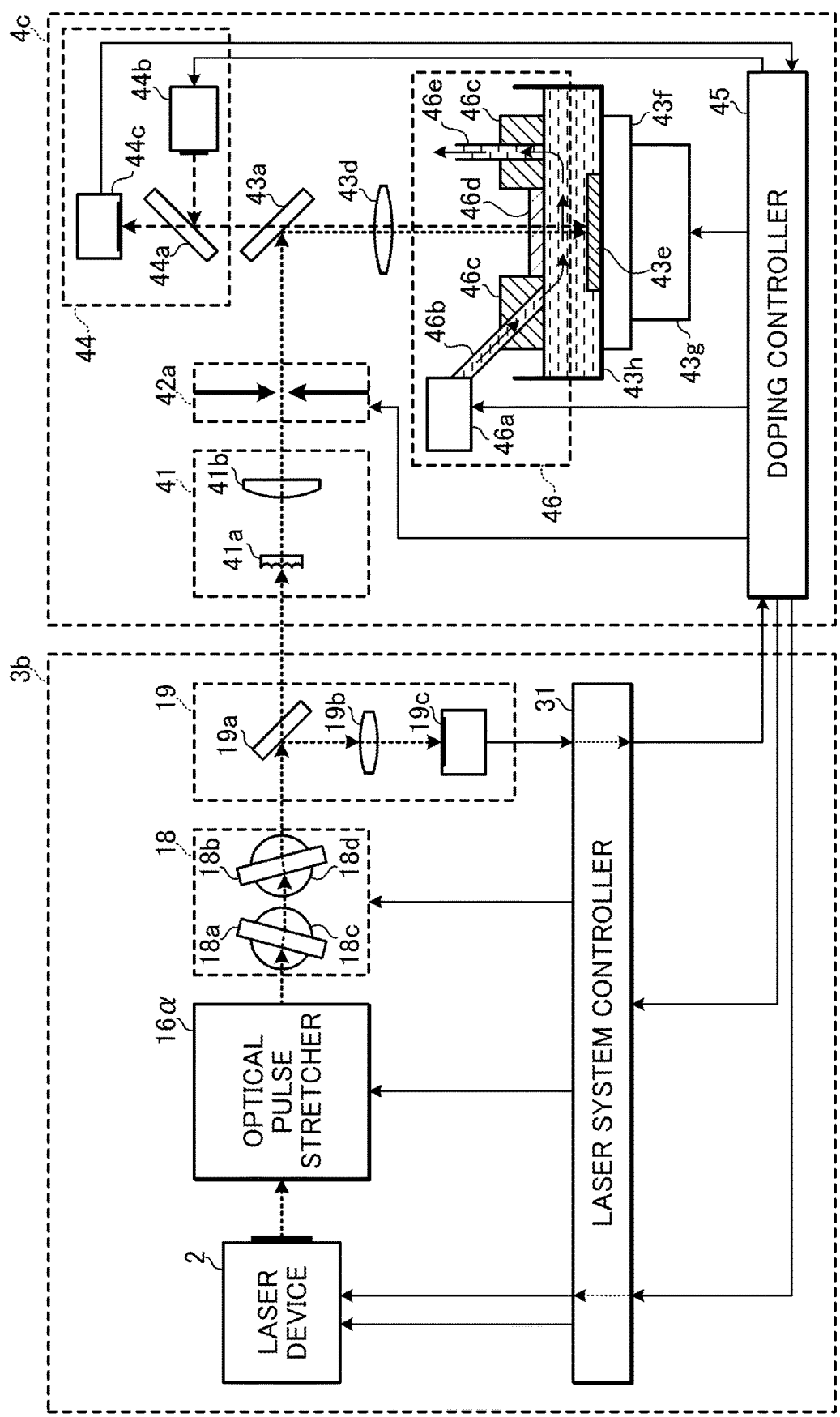
FIG. 12 schematically shows a configuration of a laser doping apparatus of a third embodiment of the present disclosure.

FIG. 12 schematically shows a configuration of a laser doping apparatus of the third embodiment of the present disclosure. In the laser doping apparatus of the third embodiment, a doping device 4c may include a variable slit 42a in place of the slit 42 described above with reference to FIG. 5. The laser system 3b and other elements are similar to that described above with reference to FIG. 5.

The variable slit 42a may have two axes substantially perpendicular to each other. The variable slit 42a may be configured to change slit widths in the two axes. The slit widths may be controlled by a control signal outputted from the doping controller 45. It is preferable that a region uniformly irradiated by the beam homogenizer 41 is larger than a region defined by the maximum slit widths of the variable slit 42a in the two axes.

5.2 Process of Doping Controller 5.2.1 Main Flow

Figure 13:
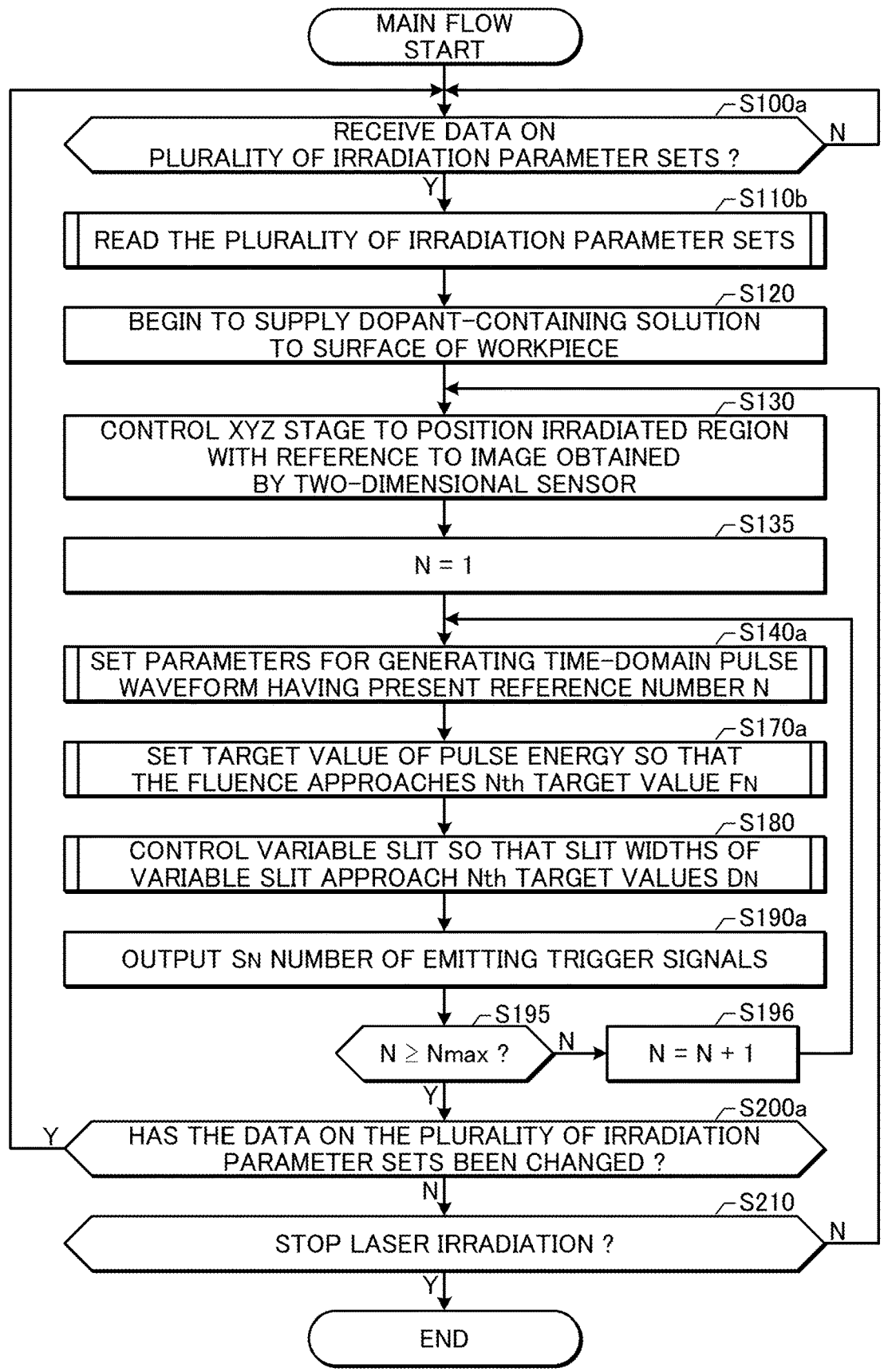
FIG. 13 is a flowchart showing a process of doping control performed by a doping controller shown in FIG. 12.

FIG. 13 is a flowchart showing a process of doping control performed by the doping controller shown in FIG. 12. In the process shown in FIG. 13, the irradiation parameter set may include the parameters for generating the time-domain pulse waveform, the fluence, and the number of pulses as described in FIG. 9. The irradiation parameter set may also include the slit widths of the variable slit 42a.

In place of S110a described above with reference to FIG. 9, the doping controller 45 may read, in S110b, a plurality of irradiation parameter sets. In S110b, each of the irradiation parameter sets may include target values of slit widths of the variable slit 42a. Other details of this process will be described later with reference to FIG. 14A. The slit widths of the variable slit 42a may be those in the two axes substantially perpendicular to each other.

Further, the doping controller 45 may control, in between S170a and S190a described above with reference to FIG. 9, the variable slit 42a such that the slit widths of the variable slit 42a approach the Nth target values $D_N$ (S180). Details of this process will be described later with reference to FIG. 14B.

The other process is similar to those described above with reference to FIG. 9.

5.2.2 Details of S110b

Figure 14A:
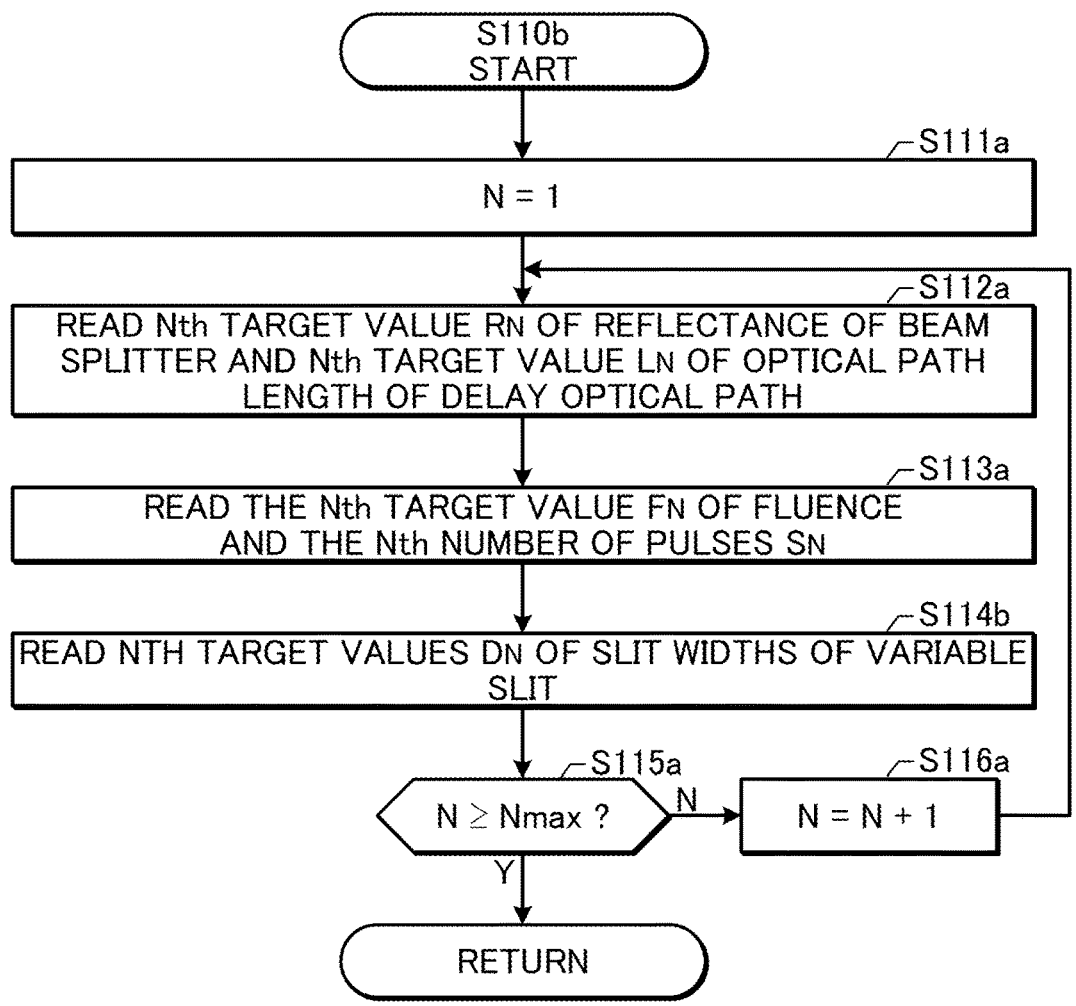
FIG. 14A is a flowchart showing details of a process shown in FIG. 13 to read irradiation parameter sets.

FIG. 14A is a flowchart showing details of the process shown in FIG. 13 to read the irradiation parameter sets. The doping controller 45 may perform the process shown in FIG. 14A as a subroutine of S110b shown in FIG. 13.

The processes in S111a to S113a may be similar to those described above with reference to FIG. 10A.

In S114b, the doping controller 45 may read the Nth target values $D_N$ of slit widths of the variable slit 42a.

Subsequent processes may be similar to those described above with reference to FIG. 10A.

5.2.3 Details of S180

Figure 14B:
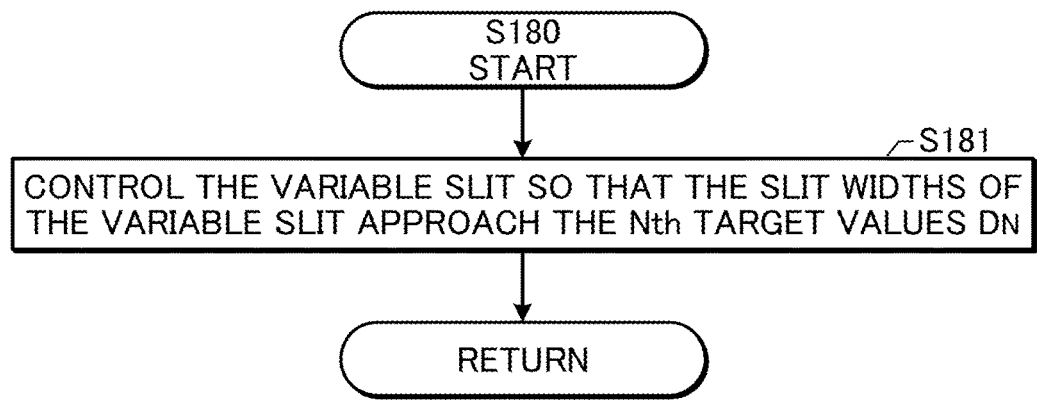

FIG. 14B is a flowchart showing details of the process shown in FIG. 13 to control the variable slit 42a. The doping controller 45 may perform the process shown in FIG. 14B as a subroutine of S180 shown in FIG. 13.

In S181, the doping controller 45 may control the variable slit 42a such that the slit widths of the variable slit 42a approach the Nth target values $D_N$.

After S181, the doping controller 45 may end the process of this flowchart to return to the process shown in FIG. 13.

Figure 15A:
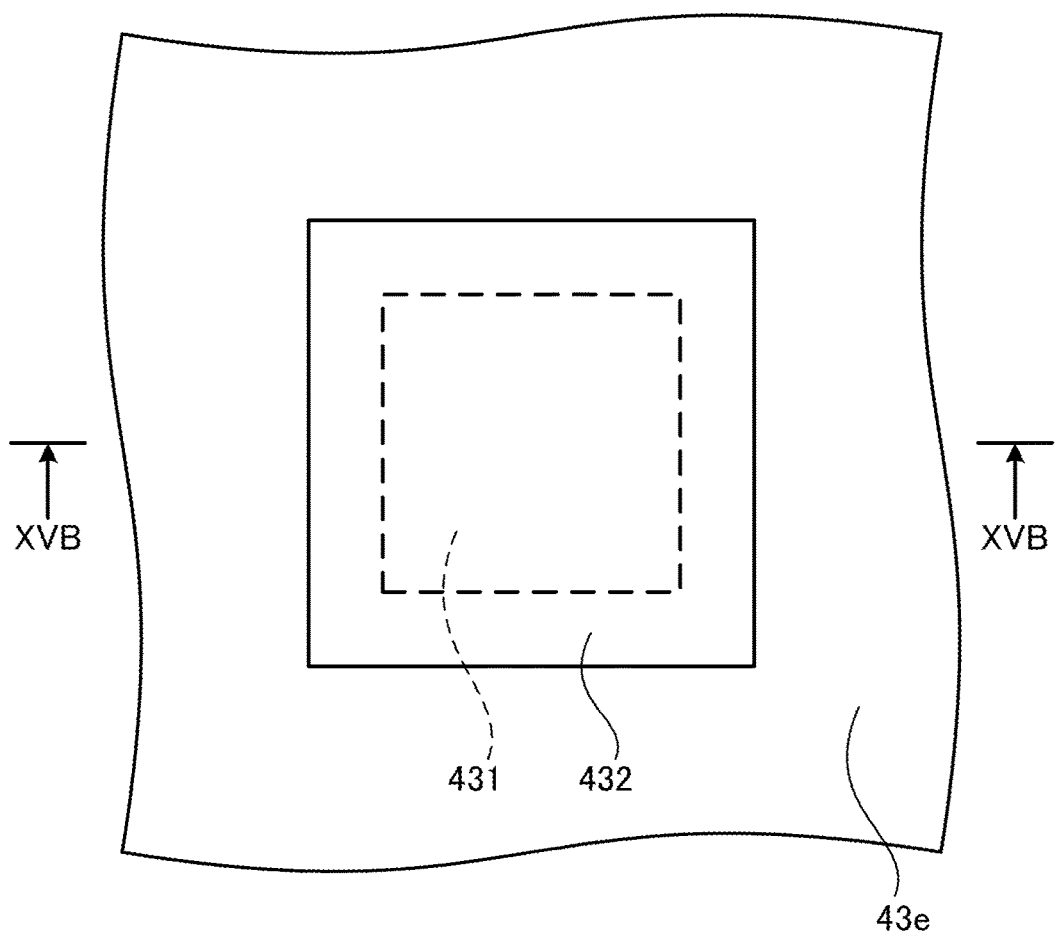
FIG. 15A schematically shows a semiconductor device made in the third embodiment.
Figure 15B:
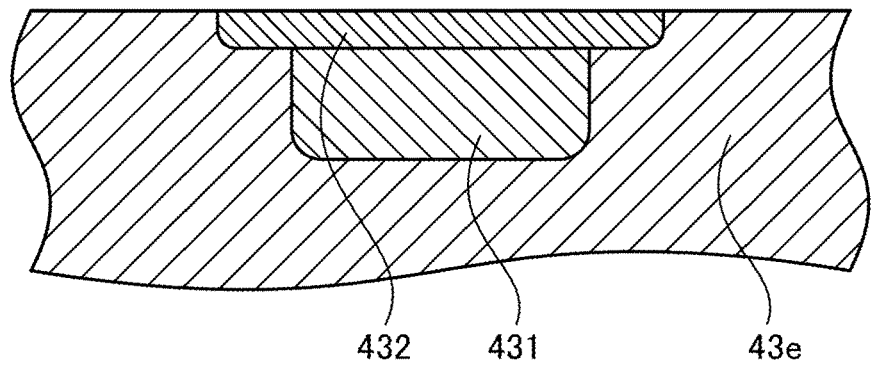
FIG. 15B is a cross sectional view of the semiconductor device at line XVB-XVB shown in FIG. 15A.

FIG. 15A schematically shows a semiconductor device made in the third embodiment. FIG. 15B is a cross sectional view of the semiconductor device at line XVB-XVB shown in FIG. 15A. In these figures, contact electrodes, an insulating film, or wiring is not illustrated. The workpiece 43e in these figures may be one where p-type layers 431 and 432 are formed by doping aluminum in a part of an n-type 4H-SiC substrate. The p-type layer 431 may have a low dopant concentration, a large doping depth, and a small area of doping region. The p-type layer 432 may have a high dopant concentration, a small doping depth, and a large area of doping region.

According to the third embodiment, the parameters for generating the time-domain pulse waveform, the target value of fluence, the number of pulses, and the target values of slit widths may be controlled separately. Thus, the dopant concentration, the doping depth, and the area of the doping region may be separately controlled.

In the third embodiment, the variable slit 42a is controlled to change the area of the doping region. However, the present disclosure is not limited to this. In place of the variable slit 42a, a mask having a desired pattern may be replaceably disposed. Replacing the mask with another mask and controlling the irradiation parameters may achieve a semiconductor device having desirable concentration distributions in both the direction of depth and the direction parallel to the surface of the workpiece.

6. Variation of Beam Splitter (Fourth Embodiment)

Figure 16A:
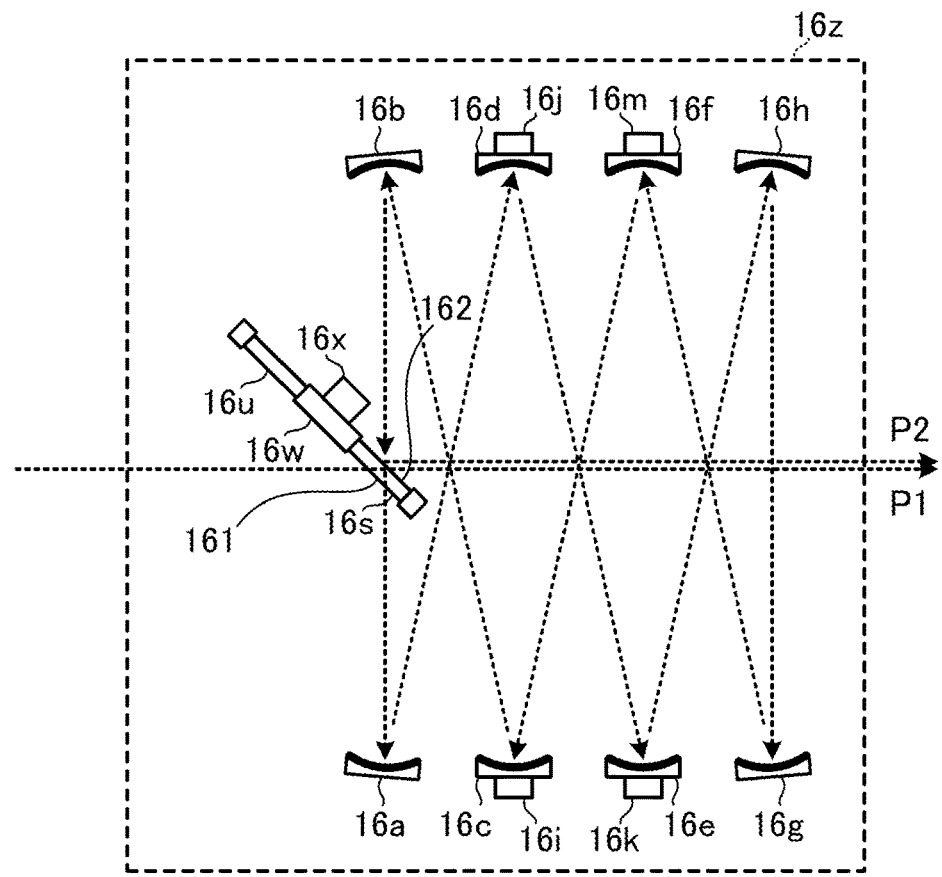
FIG. 16A shows a configuration of an optical pulse stretcher used in a laser doping apparatus of a fourth embodiment of the present disclosure.
Figure 16B:
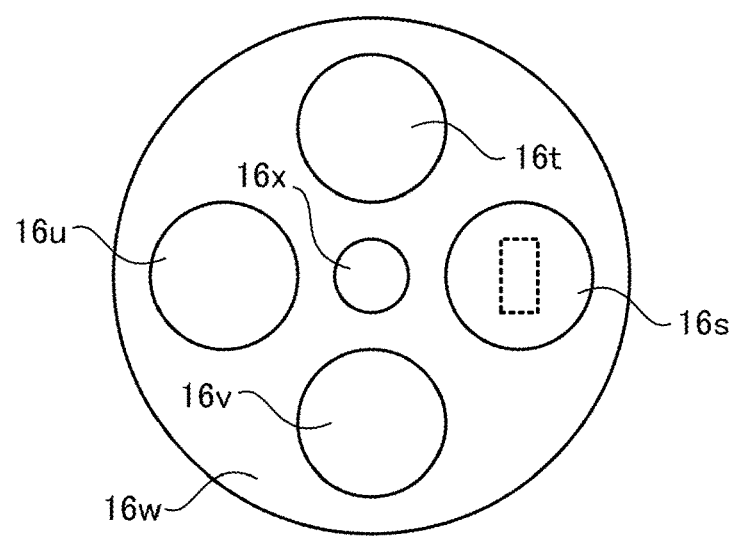
FIG. 16B shows a plurality of beam splitters used in the optical pulse stretcher shown in FIG. 16A as viewed in a direction perpendicular to reflection surfaces of the beam splitters.

FIG. 16A shows a configuration of an optical pulse stretcher used in a laser doping apparatus of a fourth embodiment of the present disclosure. FIG. 16B shows a plurality of beam splitters used in the optical pulse stretcher shown in FIG. 16A as viewed in a direction perpendicular to the reflection surfaces of the beam splitters.

An optical pulse stretcher 16z used in the fourth embodiment may include beam splitters 16s, 16t, 16u, and 16v. The beam splitters 16s, 16t, 16u, and 16v may have different reflectances from each other. The beam splitters 16s, 16t, 16u, and 16v may be supported by a holder 16w. The holder 16w may be rotatably supported by a stepping motor 16x.

A laser system controller 31 (see FIG. 2) may be able to selectively locate the beam splitters 16s, 16t, 16u, and 16v in the optical path of the pulse laser beam by controlling the stepping motor 16x. Whichever of the beam splitters 16s, 16t, 16u, and 16v is located in the optical path of the pulse laser beam, incident angles of the pulse laser beam may be the same, and the reflectances of the beam splitters may be different from each other. Thus, the time-domain pulse waveform of the pulse laser beam outputted from the optical pulse stretcher 16z may be changed.

The other elements may be similar to those of the first embodiment. Alternatively, the optical pulse stretcher 16z shown in FIGS. 16A and 16B may be used in the second or third embodiment.

7. Laser Doping Apparatus Including Plurality of Laser Units (Fifth Embodiment)

7.1 Configuration and Operation

Figure 17:
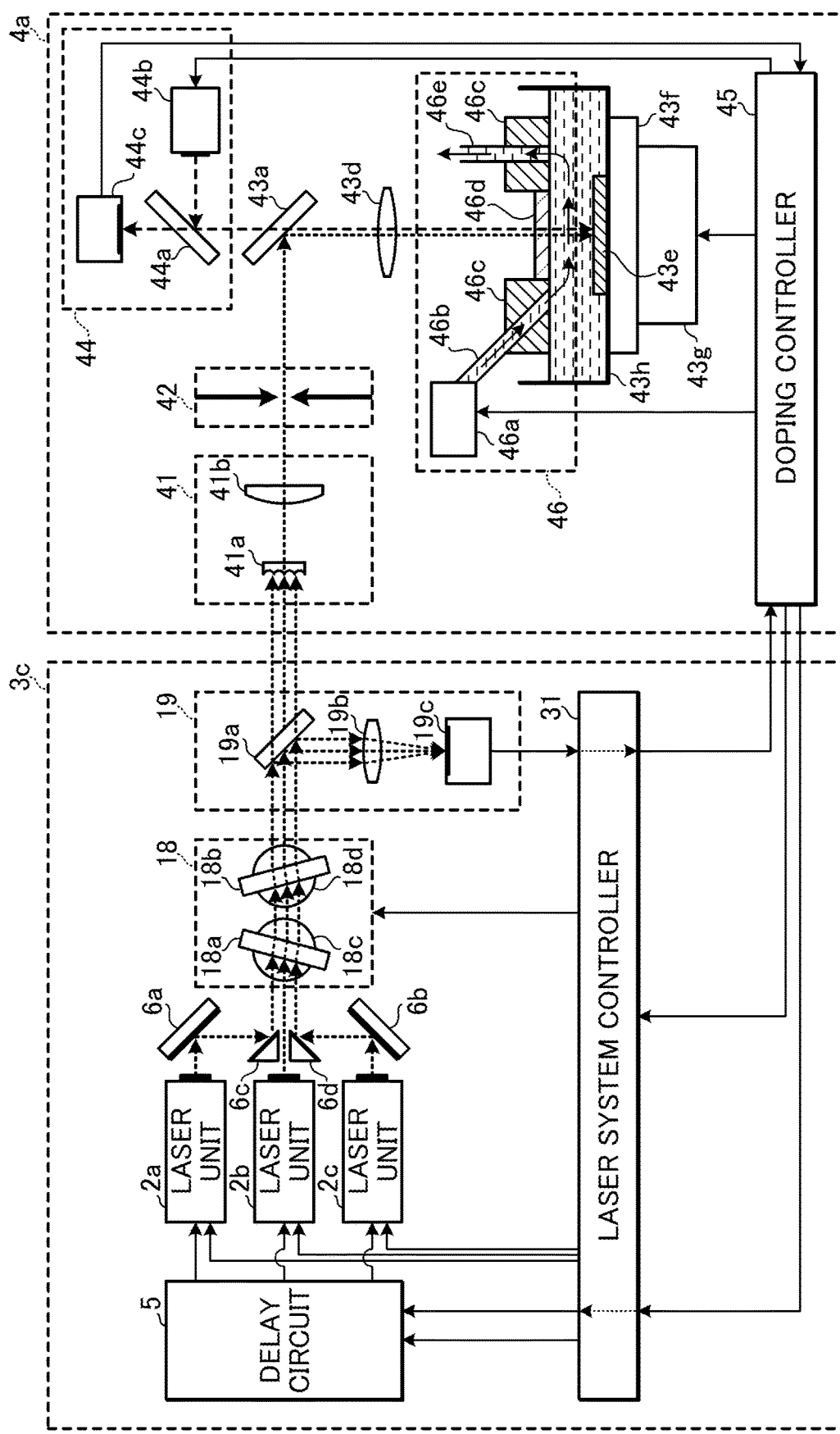
FIG. 17 schematically shows a configuration of a laser doping apparatus of a fifth embodiment of the present disclosure.

FIG. 17 schematically shows a configuration of a laser doping apparatus of a fifth embodiment of the present disclosure. In the laser doping apparatus of the fifth embodiment, a laser system 3c may include first, second, and third laser units 2a, 2b, and 2c, a delay circuit 5, high-reflective mirrors 6a and 6b, and knife-edge mirrors 6c and 6d. In the laser doping apparatus of the fifth embodiment, an optical pulse stretcher is not necessary in the laser system 3c.

The other elements may be similar to those of the first to third embodiments.

The first, second, and third laser units 2a, 2b, and 2c may each have a configuration similar to that of the above-described laser device 2. Each laser unit may receive data on the target value of pulse energy from the laser system controller 31. The data on the target value of pulse energy may vary for each of the first, second, and third laser units 2a, 2b, and 2c. Based on the received data on the target value of pulse energy, charging voltage for each laser unit may be set to a charging capacitor described later.

The delay circuit 5 may receive delay time setting data from the laser system controller 31. The delay circuit 5 may also receive an emitting trigger signal outputted from the doping controller 45 through the laser system controller 31. Upon expiration of the set delay time after receiving the emitting trigger signal, the delay circuit 5 may output first, second, and third trigger signals to the first, second, and third laser units 2a, 2b, and 2c, respectively, in this order.

The high-reflective mirror 6a and the knife-edge mirror 6c may reflect a pulse laser beam outputted from the first laser unit 2a with high reflectance. The pulse laser beam outputted from the first laser unit 2a may thus be directed to an optical path that is approximately parallel with and close to an optical path of a pulse laser beam outputted from the second laser unit 2b, and be outputted toward the attenuator 18.

The high-reflective mirror 6b and the knife-edge mirror 6d may reflect a pulse laser beam outputted from the third laser unit 2c with high reflectance. The pulse laser beam outputted from the third laser unit 2c may thus be directed to an optical path that is approximately parallel with and close to the optical path of the pulse laser beam outputted from the second laser unit 2b, and be outputted toward the attenuator 18.

The pulse laser beams outputted from the first, second, and third laser units 2a, 2b, and 2c may travel through the attenuator 18 and the pulse waveform measuring unit 19 and then enter the beam homogenizer 41. The beam homogenizer 41 may perform Koehler-illumination on the slit 42, and the optical paths of these pulse laser beams may coincide with each other at the slit 42. Thus, it is possible to uniform the optical intensity distribution of the beams at the opening of the slit 42.

Figure 18:
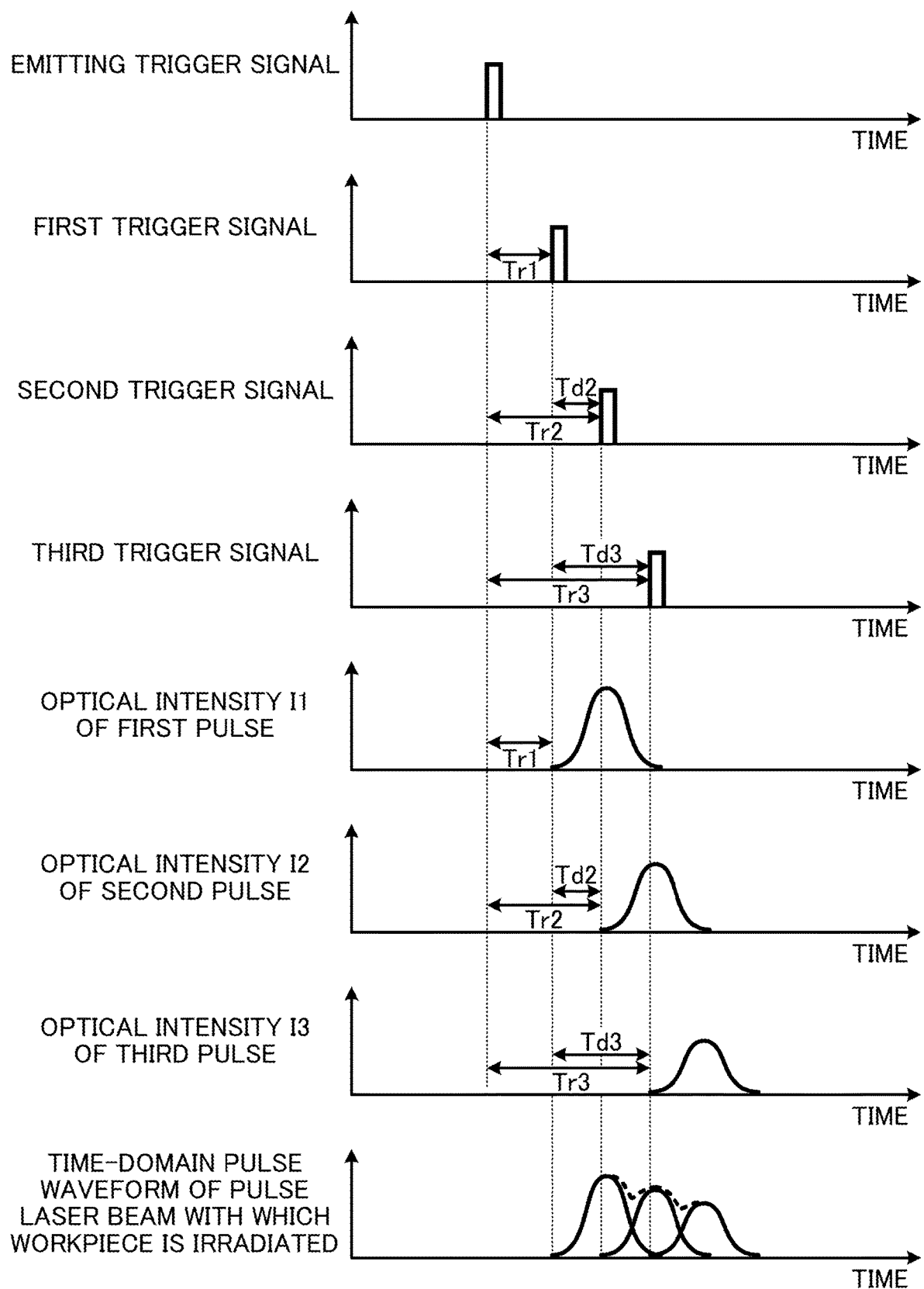
FIG. 18 is a timing chart of trigger signals and a pulse laser beam in the laser doping apparatus shown in FIG. 17.

FIG. 18 is a timing chart of the trigger signals and the pulse laser beam in the laser doping apparatus shown in FIG. 17. In the fifth embodiment, the pulse laser beams outputted from the first, second, and third laser units 2a, 2b, and 2c may be combined to irradiate the workpiece with a pulse laser beam having a desired time-domain pulse waveform.

The first trigger signal outputted from the delay circuit 5 to the first laser unit 2a may have a delay time Tr1 from the emitting trigger signal outputted from the laser system controller 31 to the delay circuit 5.

The second trigger signal outputted from the delay circuit 5 to the second laser unit 2b may have a delay time Tr2 from the emitting trigger signal outputted from the laser system controller 31 to the delay circuit 5.

The third trigger signal outputted from the delay circuit 5 to the third laser unit 2c may have a delay time Tr3 from the emitting trigger signal outputted from the laser system controller 31 to the delay circuit 5.

Upon receiving the first trigger signal, the first laser unit 2a may output a first pulse to constitute the pulse laser beam. A time of receiving the first trigger signal and a time of rising of the first pulse may substantially coincide with each other.

Upon receiving the second trigger signal, the second laser unit 2b may output a second pulse to constitute the pulse laser beam. A time of receiving the second trigger signal and a time of rising of the second pulse may substantially coincide with each other. A time interval Td2 between the first pulse and the second pulse may thus correspond to a difference between the delay time Tr1 of the first trigger signal and the delay time Tr2 of the second trigger signal.

Upon receiving the third trigger signal, the third laser unit 2c may output a third pulse to constitute the pulse laser beam. A time of receiving the third trigger signal and a time of rising of the third pulse may substantially coincide with each other. A time interval Td3 between the first pulse and the third pulse may thus correspond to a difference between the delay time Tr1 of the first trigger signal and the delay time Tr3 of the third trigger signal.

The first to third pulses outputted from the respective first to third laser units 2a to 2c may have time-domain pulse waveforms different from each other. In particular, charging voltages of the charging capacitors of the respective first to third laser units 2a to 2c may be set according to the respective target values of pulse energy. For example, an optical intensity ratio Er2 of the peak value of the optical intensity I2 of the second pulse outputted from the second laser unit 2b to the peak value of the optical intensity I1 of the first pulse outputted from the first laser unit 2a may be set to a value less than 1. Further, an optical intensity ratio Er3 of the peak value of the optical intensity I3 of the third pulse outputted from the third laser unit 2c to the peak value of the optical intensity I1 of the first pulse outputted from the first laser unit 2a may be set to a value less than Er2.

The first to third pulses may be made close to each other with the high-reflective mirrors 6a and 6b and the knife-edge mirrors 6c and 6d, and may coincide with each other by the beam homogenizer 41. The workpiece 43e may thus be irradiated with the pulse laser beam having a long pulse width made by superposing the waveforms of the first to third pulses having the delay times different from each other. The delay circuit 5 may correspond to a time-domain pulse waveform changing apparatus in the present disclosure.

7.2 Process of Doping Controller 7.2.1 Main Flow

Figure 19:
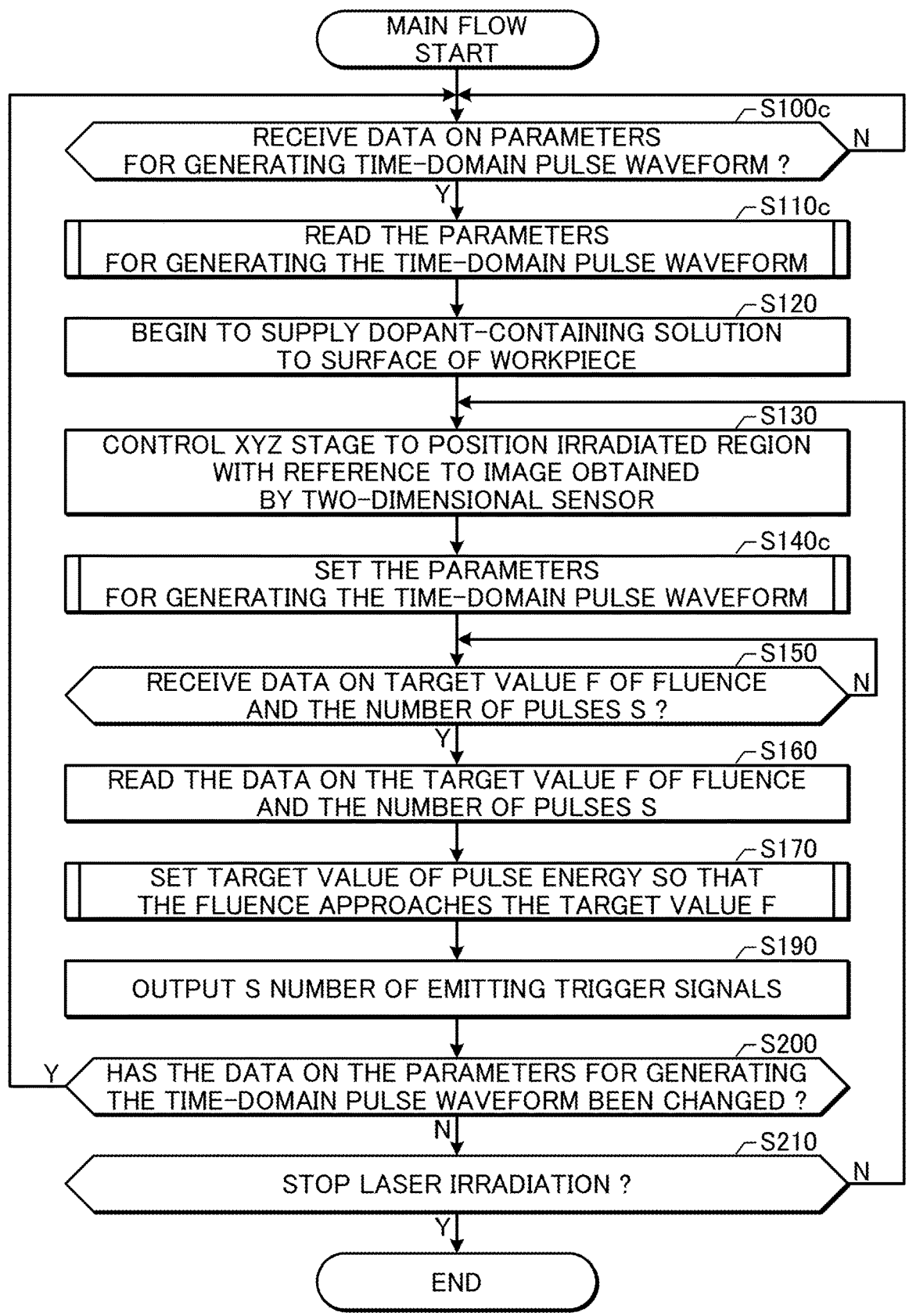
FIG. 19 is a flowchart showing a process of doping control performed by a doping controller shown in FIG. 17.

FIG. 19 is a flowchart showing a process of doping control performed by the doping controller shown in FIG. 17. The doping controller 45 may perform doping with the pulse laser beam having a desired time-domain pulse waveform in the following process.

In S100c and S110c, the doping controller 45 may receive and read the parameters for generating the time-domain pulse waveform. Here, the parameters for generating the time-domain pulse waveform may include a target value of time interval of each adjacent two of the pulse laser beams outputted from the first, second, and third laser units 2a, 2b, and 2c, and a target value of optical intensity ratio of each adjacent two of the pulse laser beams outputted from the first, second, and third laser units 2a, 2b, and 2c.

Details of the process in S110c will be described later with reference to FIG. 20A. In the other aspects, the processes of S100c and S110c may be similar to those of S100 and S110 described above with reference to FIG. 7. The next processes of S120 and S130 may be similar to those described above with reference to FIG. 7.

Then, in S140c, the doping controller 45 may set the parameters for generating the time-domain pulse waveform for the laser system 3c. Specifically, the doping controller 45 may send the target value of time interval of each adjacent two of the pulse laser beams outputted from the first, second, and third laser units 2a, 2b, and 2c and the target value of optical intensity ratio of each adjacent two of the pulse laser beams outputted from the first, second, and third laser units 2a, 2b, and 2c to the laser system controller 31. Details of this process will be described later with reference to FIG. 20B.

Subsequent processes may be similar to those described above with reference to FIG. 7.

7.2.2 Details of S110c

Figure 20A:
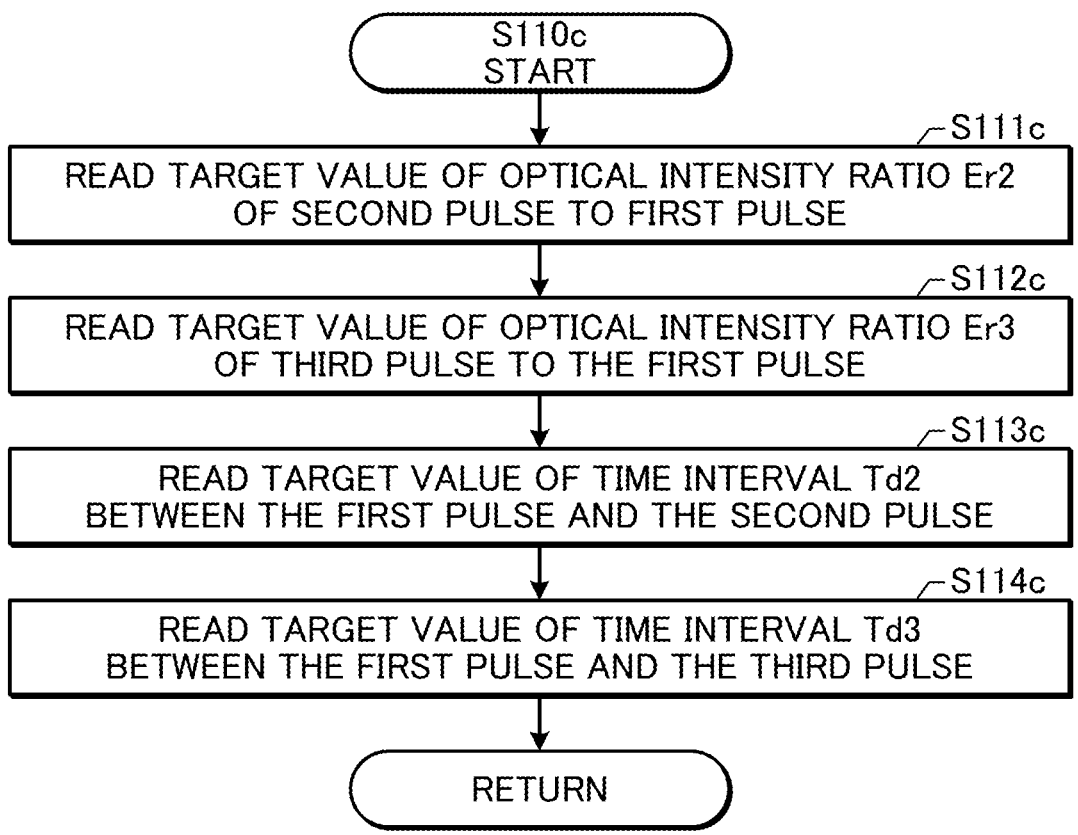
FIG. 20A is a flowchart showing details of a process shown in FIG. 19 to read parameters for generating a time-domain pulse waveform.

FIG. 20A is a flowchart showing details of the process shown in FIG. 19 to read parameters for generating the time-domain pulse waveform. The doping controller 45 may perform the process shown in FIG. 20A as a subroutine of S110c shown in FIG. 19.

First, in S111c, the doping controller 45 may read a target value of the optical intensity ratio Er2 of the second pulse outputted from the second laser unit 2b to the first pulse outputted from the first laser unit 2a.

Then, in S112c, the doping controller 45 may read a target value of the optical intensity ratio Er3 of the third pulse outputted from the third laser unit 2c to the first pulse outputted from the first laser unit 2a.

Then, in S113c, the doping controller 45 may read a target value of the time interval Td2 between the first pulse outputted from the first laser unit 2a and the second pulse outputted from the second laser unit 2b.

Then, in S114c, the doping controller 45 may read a target value of the time interval Td3 between the first pulse outputted from the first laser unit 2a and the third pulse outputted from the third laser unit 2c.

After S114c, the doping controller 45 may end the process of this flowchart to return to the process shown in FIG. 19.

7.2.3 Details of S140c

Figure 20B:
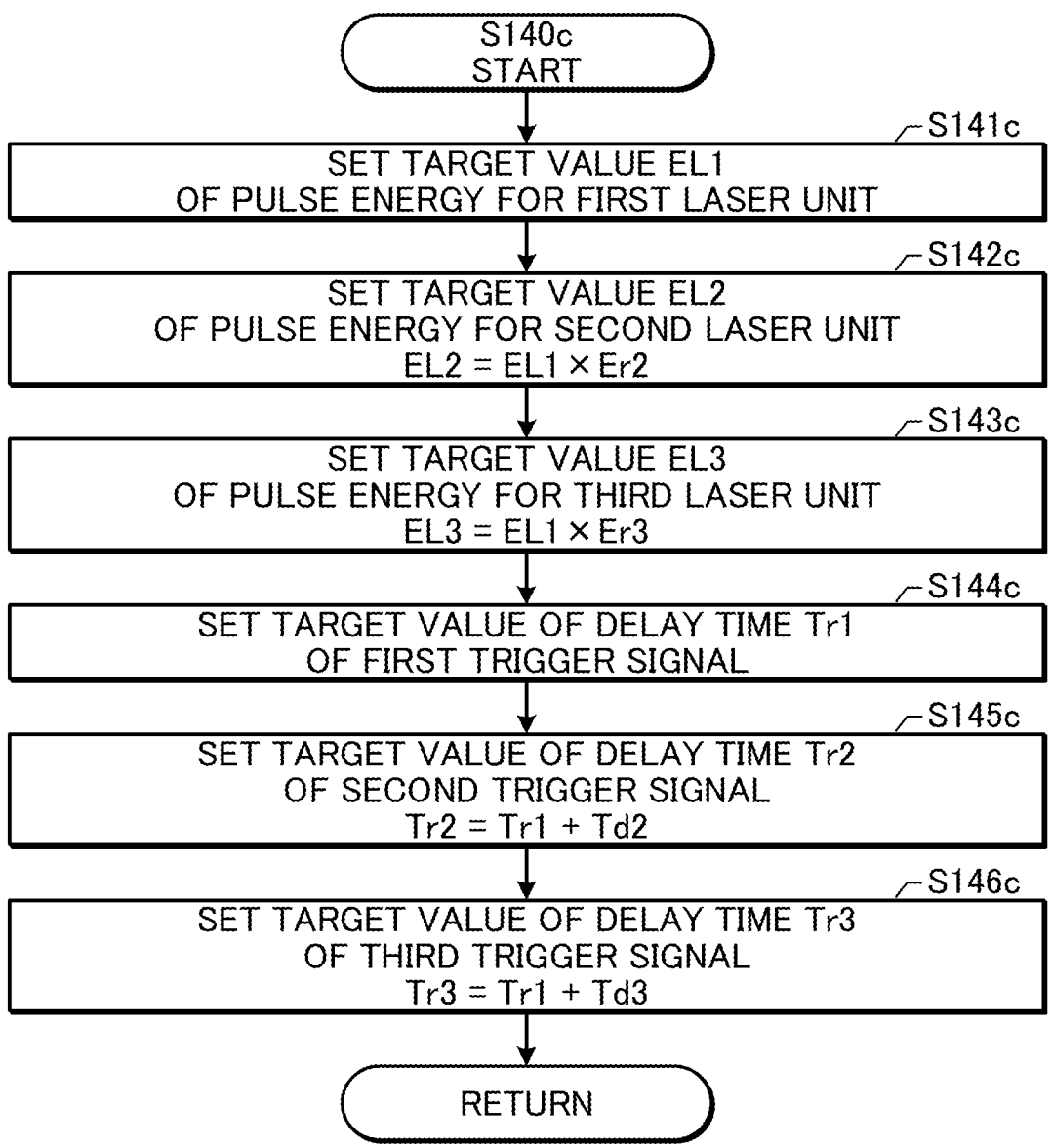
FIG. 20B is a flowchart showing details of a process shown in FIG. 19 to set parameters for generating the time-domain pulse waveform.

FIG. 20B is a flowchart showing details of the process shown in FIG. 19 to set the parameters for generating the time-domain pulse waveform. The doping controller 45 may perform the process shown in FIG. 20B as a subroutine of S140c shown in FIG. 19.

First, in S141c, the doping controller 45 may send the target value EL1 of pulse energy for the first laser unit 2a to the laser system controller 31. The laser system controller 31 may thus control the first laser unit 2a such that the pulse energy of the first pulse approaches the target value EL1 of pulse energy.

Then, in S142c, the doping controller 45 may send the target value EL2 of pulse energy for the second laser unit 2b to the laser system controller 31. The target value EL2 of pulse energy of the second laser unit 2b may be calculated as follows.

$$EL2 = EL1 \times Er2$$

The laser system controller 31 may thus control the second laser unit 2b such that the pulse energy of the second pulse approaches the target value EL2 of pulse energy.

Then, in S143c, the doping controller 45 may send the target value EL3 of pulse energy for the third laser unit 2c to the laser system controller 31. The target value EL3 of pulse energy of the third laser unit 2c may be calculated as follows.

$$EL3 = EL1 \times Er3$$

The laser system controller 31 may thus control the third laser unit 2c such that the pulse energy of the third pulse approaches the target value EL3 of pulse energy.

In each laser unit, the charging voltage of the charging capacitor may be set such that the pulse energy of the pulse laser beam outputted from each laser unit approaches the target value of pulse energy. Setting the charging voltage in this manner may allow the optical intensity ratio of the pulse laser beams outputted from the laser units to approach the target value of the optical intensity ratio. If the pulse energy of the pulse laser beam cannot be made close to the target value of pulse energy by controlling the charging voltage, the pulse energy may be made close to the target value of pulse energy by controlling pressure of laser gas in a laser chamber described later.

Then, in S144c, the doping controller 45 may send a target value of the delay time Tr1 of the first pulse outputted from the first laser unit 2a to the laser system controller 31. The laser system controller 31 may thus control the delay circuit 5 such that the delay time Tr1 of the first pulse approaches the target value.

Then, in S145c, the doping controller 45 may send a target value of the delay time Tr2 of the second pulse outputted from the second laser unit 2b to the laser system controller 31. The target value of the delay time Tr2 of the second pulse may be calculated as follows.

$$Tr2=Tr1+Td2$$

The laser system controller 31 may thus control the delay circuit 5 such that the delay time Tr2 of the second pulse approaches the target value.

Then, in S146c, the doping controller 45 may send a target value of the delay time Tr3 of the third pulse outputted from the third laser unit 2c to the laser system controller 31. The target value of the delay time Tr3 of the third pulse may be calculated as follows.

$$Tr3=Tr1+Td3$$

The laser system controller 31 may thus control the delay circuit 5 such that the delay time Tr3 of the third pulse approaches the target value.

After S146c, the doping controller 45 may end the process of this flowchart to return to the process shown in FIG. 19.

7.3 Effect

In the fifth embodiment, the output timing of the pulse laser beam outputted from each of the laser units may be set by the delay circuit 5. The optical intensity ratio of the pulse laser beams outputted from the laser units may be set by the charging voltages of the charging capacitors of the laser units.

In the fifth embodiment, the target value of pulse energy for each of the first to third laser units 2a to 2c is set to control the optical intensity ratio of the first to third pulses. Additionally, the attenuator 18 may be controlled to change fluence of the pulse laser beam with which the workpiece is irradiated.

According to the fifth embodiment, the output timing of the pulse laser beam from each of the laser units and the optical intensity ratio may be separately set. Thus, flexibility in obtaining a time-domain pulse waveform of a pulse laser beam by combining pulse laser beams may be improved compared to those of the first to fourth embodiments.

8. Laser Doping Apparatus Using Boron-Containing Solution (Sixth Embodiment)

Figure 21:
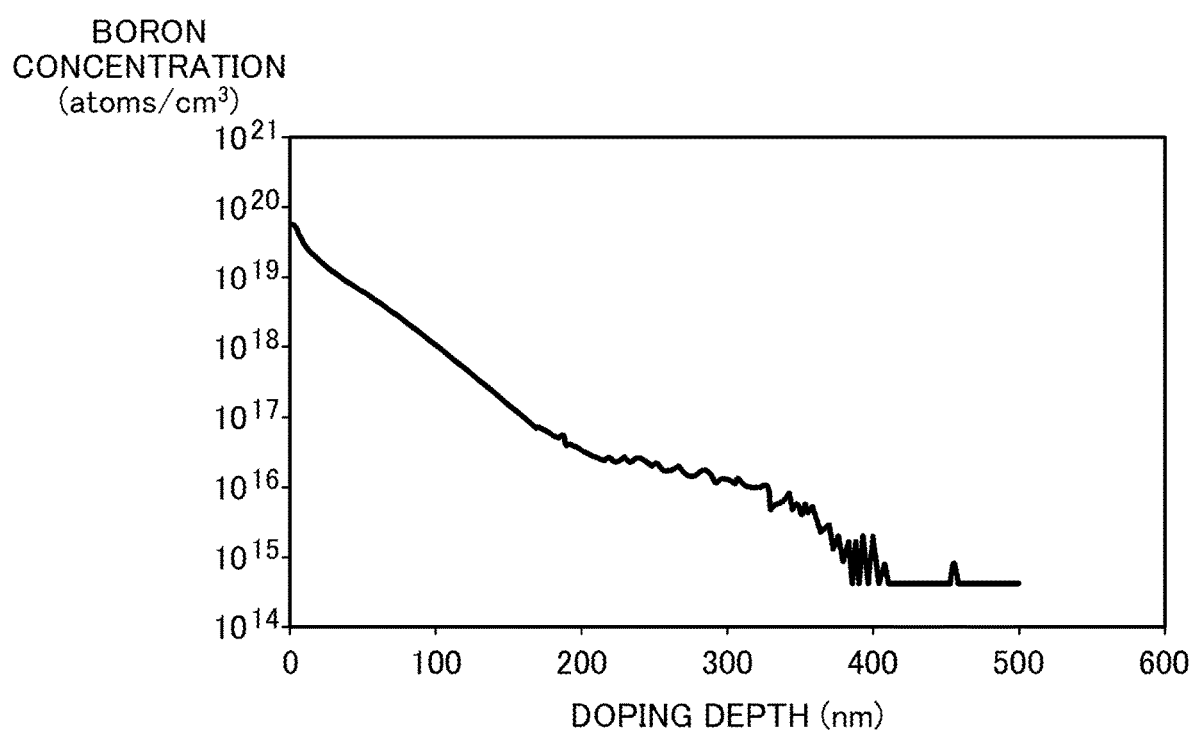
FIG. 21 is a graph showing a relationship between concentration and doping depth of boron that is doped in 4H-SiC when boron-containing solution is used as dopant-containing solution in a laser doping apparatus of a sixth embodiment of the present disclosure.

FIG. 21 is a graph showing a relationship between concentration and doping depth of boron that is doped in 4H-SiC when boron-containing solution is used as the dopant-containing solution in a laser doping apparatus of a sixth embodiment of the present disclosure. Illustration of the laser doping apparatus of the sixth embodiment is omitted. However, the laser doping apparatus of the sixth embodiment may be similar to that described above with reference to FIG. 1 except that the boron-containing solution is used. In the sixth embodiment, the pulse-stretching of the pulse laser beam is not necessary.

Boric acid aqueous solution at the saturated concentration was used as the dopant-containing solution. A KrF excimer laser beam was used as the pulse laser beam. Fluence of the laser beam was 4.5 J/cm² per one pulse, and the number of irradiation pulses for one position was one pulse. The pulse width $\Delta T_{TIS}$ was 50 ns.

In a case where aluminum was used as a p-type dopant in doping impurities by irradiating SiC with a laser beam in solution that contains the p-type dopant, doping depth of 40 nm or more was not achieved. In the sixth embodiment, using boron as the p-type dopant may achieve doping depth of approximately 400 nm without pulse-stretching.

While the 4H-SiC is subjected to boron doping in FIG. 21 as an example, the present disclosure is not limited to this example. Large doping depth may be achieved by irradiating diamond or GaN in the boron-containing solution with the pulse laser beam without stretching the pulse width.

9. Others 9.1 Details of Laser Device

Figure 22:
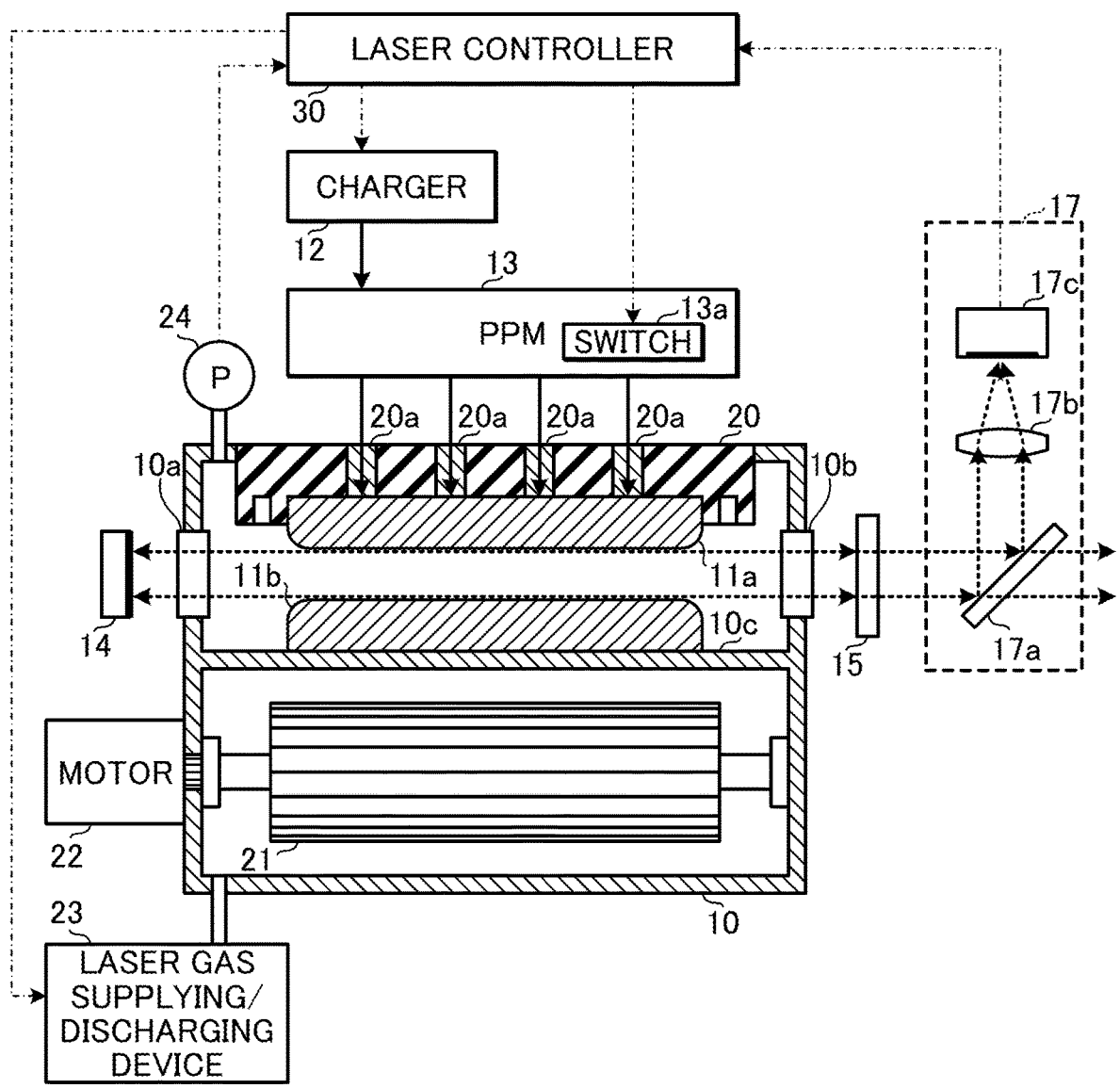
FIG. 22 shows a detailed configuration of a laser device in the above-described embodiments.

FIG. 22 shows a detailed configuration of the above-described laser device. As shown in FIG. 22, the laser device 2 may include a laser chamber 10, a pair of electrodes 11a and 11b, a charger 12, and a pulse power module (PPM) 13. FIG. 22 shows an internal configuration of the laser chamber 10 as viewed in a direction approximately perpendicular to the traveling direction of the laser beam.

The laser device 2 may also include a cross-flow fan 21 and a motor 22. The laser device 2 may further include a high-reflective mirror 14, an output coupling mirror 15, a pulse energy measuring unit 17, a laser controller 30, and a laser gas supplying/discharging device 23.

The laser chamber 10 may be a chamber in which the above-described laser medium is sealed. A pressure sensor 24 may be connected to the laser chamber 10 via a tube so as to measure a pressure of the laser gas in the laser chamber 10. The pair of electrodes 11a and 11b may be disposed in the laser chamber 10 as electrodes for exciting the laser medium by electric discharge. The laser chamber 10 may have an opening sealed by an insulating member 20. The electrode 11a may be supported by the insulating member 20, and the electrode 11b may be supported by an internal partition plate 10c of the laser chamber 10. Conductive elements 20a may be embedded in the insulating member 20. The conductive elements 20a may electrically connect high-voltage terminals of the pulse power module 13 and the electrode 11a so that a high voltage from the pulse power module 13 is applied to the electrode 11a. The laser gas supplying/discharging device 23 may be connected to the laser chamber 10 via a gas tube.

The rotary shaft of the cross-flow fan 21 may be connected to the motor 22 disposed on the outside of the laser chamber 10. When the motor 22 rotates the cross-flow fan 21, the laser gas may be circulated in the laser chamber 10.

The charger 12 and the pulse power module 13 may constitute a power source. The pulse power module 13 may include a charging capacitor and a switch 13a. An output of the charger 12 may be connected to the charging capacitor. The charger 12 may hold electric energy for applying the high voltage between the pair of electrodes 11a and 11b.

When the switch 13a controlled by the laser controller 30 is turned on, the pulse power module 13 may generate a pulsed high voltage from the electric energy in the charging capacitor and apply the high voltage between the pair of electrodes 11a and 11b.

The application of the high voltage between the pair of electrodes 11a and 11b may cause electric discharge therebetween. The energy of the electric discharge may excite the laser medium in the laser chamber 10 to shift to a high energy level. The laser medium may then shift back to a low energy level, generating light having a wavelength according to the difference in the energy levels.

The laser chamber 10 may be provided with windows 10a and 10b at both ends thereof. The light generated in the laser chamber 10 may be emitted through the windows 10a and 10b.

The light emitted from the window 10a of the laser chamber 10 may be reflected by the high-reflective mirror 14 with a high reflectance to be returned into the laser chamber 10.

The output coupling mirror 15 may be coated with a partial reflection film. A part of the light emitted from the window 10b of the laser chamber 10 may be transmitted by the output coupling mirror 15 to be outputted. Another part of the light may be reflected to be returned into the laser chamber 10.

The high-reflective mirror 14 and the output coupling mirror 15 may constitute an optical resonator. The light emitted from the laser chamber 10 may travel back and forth between the high-reflective mirror 14 and the output coupling mirror 15. The light may be amplified each time it passes through the laser gain region between the electrodes 11a and 11b. A part of the amplified light may be outputted as a pulse laser beam through the output coupling mirror 15.

The pulse energy measuring unit 17 may include a beam splitter 17a, focusing optics 17b, and an optical sensor 17c. A part of the pulse laser beam transmitted by the output coupling mirror 15 may be transmitted by the beam splitter 17a at a high transmittance. Another part of the pulse laser beam may be reflected by the beam splitter 17a to the focusing optics 17b. The light reflected by the beam splitter 17a may be focused by the focusing optics 17b on the photosensitive surface of the optical sensor 17c. The optical sensor 17c may detect the pulse energy of the laser beam focused on the photosensitive surface and output data on the detected pulse energy to the laser controller 30.

The laser controller 30 may send, for example, a charging voltage setting signal to the charger 12 or an emitting trigger signal to the switch 13a of the pulse power module 13. Further, the laser controller 30 may control the laser gas supplying/discharging device 23 based on an output value from the pressure sensor 24 to control the pressure of the laser gas in the laser chamber 10.

The laser controller 30 may receive the data on the detected pulse energy from the pulse energy measuring unit 17. With reference to the data on the detected pulse energy, the laser controller 30 may control the charging voltage of the charger 12 and control the pressure of the laser gas in the laser chamber 10. Controlling the charging voltage of the charger 12 and the pressure of the laser gas may enable controlling the pulse energy of the pulse laser beam. The laser controller 30 may also count the number of oscillation pulses of the excimer laser device based on the data received from the pulse energy measuring unit 17.

Figure 23:
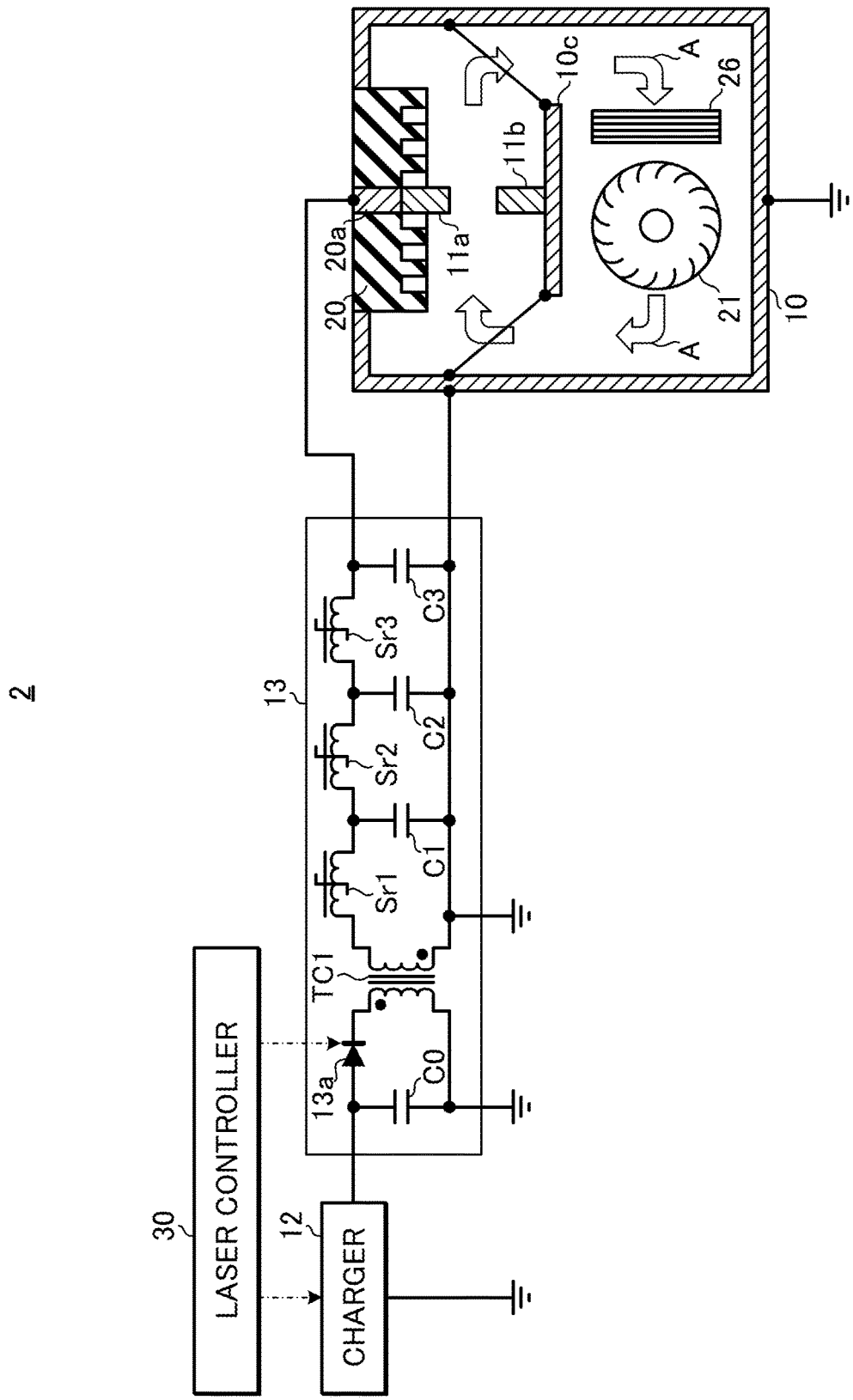
FIG. 23 shows an internal configuration of a laser chamber shown in FIG. 22 and a configuration of a pulse power module shown in FIG. 22.

FIG. 23 shows an internal configuration of the laser chamber shown in FIG. 22 and a configuration of the pulse power module shown in FIG. 22. FIG. 23 shows an internal configuration of the laser chamber 10 as viewed in a direction approximately parallel to the traveling direction of a laser beam. A conductive member of the laser chamber 10 including the internal partition plate 10c may be connected to the ground potential. The electrode 11b may be connected to the ground potential through the internal partition plate 10c.

The laser chamber 10 may contain the pair of electrodes 11a and 11b, the cross-flow fan 21, and a heat exchanger 26. The cross-flow fan 21 may rotate such that the laser gas may be circulated in the laser chamber 10 as shown by arrows A. When the laser gas is heated by the electric discharge, the heat exchanger 26 may exhaust the heat energy of the laser gas out of the laser chamber 10.

The pulse power module 13 may include a charging capacitor C0, the switch 13a, a boosting transformer TC1, magnetic switches Sr1 to Sr3, and capacitors C1 to C3.

The magnetic switches Sr1 to Sr3 may each include a saturable reactor. Each of the magnetic switches Sr1 to Sr3 may be switched to a low impedance state when the time integral of the voltage applied across the magnetic switch becomes a predetermined threshold determined by the properties of the magnetic switch.

The laser controller 30 may set a charging voltage of the charger 12. The charger 12 may charge the charging capacitor C0 in accordance with the set charging voltage.

The switch 13a of the pulse power module 13 may receive the emitting trigger signal from the laser controller 30. Upon receiving the emitting trigger signal, the switch 13a may be turned on. When the switch 13a is turned on, electric current may flow from the charging capacitor C0 to the primary side of the boosting transformer TC1.

The electric current flowing through the primary side of the boosting transformer TC1 may cause electromagnetic induction to generate reverse electric current to flow through the secondary side of the boosting transformer TC1. The reverse electric current flowing through the secondary side of the boosting transformer TC1 may allow the time integral of the voltage across the magnetic switch Sr1 to reach the threshold.

When the time integral of the voltage across the magnetic switch Sr1 reaches the threshold, the magnetic switch Sr1 may be magnetically saturated and closed.

When the magnetic switch Sr1 is closed, electric current may flow from the secondary side of the boosting transformer TC1 to the capacitor C1 to charge the capacitor C1.

Charging the capacitor C1 may allow the magnetic switch Sr2 to be magnetically saturated and closed.

When the magnetic switch Sr2 is closed, electric current may flow from the capacitor C1 to the capacitor C2 to charge the capacitor C2. The electric current to charge the capacitor C2 may have a shorter pulse width than the electric current to charge the capacitor C1.

Charging the capacitor C2 may allow the magnetic switch Sr3 to be magnetically saturated and closed.

When the magnetic switch Sr3 is closed, electric current may flow from the capacitor C2 to the capacitor C3 to charge the capacitor C3. The electric current to charge the capacitor C3 may have a shorter pulse width than the electric current to charge the capacitor C2.

As seen above, the electric current may sequentially flow from the capacitor C1 to the capacitor C2 and then from the capacitor C2 to the capacitor C3. The pulse width of the electric current may thus be compressed, and the voltage may be increased.

When the voltage across the capacitor C3 reaches a breakdown voltage of the laser gas, the laser gas may be dielectrically broken down between the pair of electrodes 11a and 11b. Thus, the laser gas may be excited, causing laser oscillation, and the pulse laser beam may be outputted. Since the above-described discharge operation is repeated with the switching operation of the switch 13a, the pulse laser beam may be emitted at a predetermined oscillation frequency.

9.2 Configuration of Fly-Eye Lens

Figure 24:
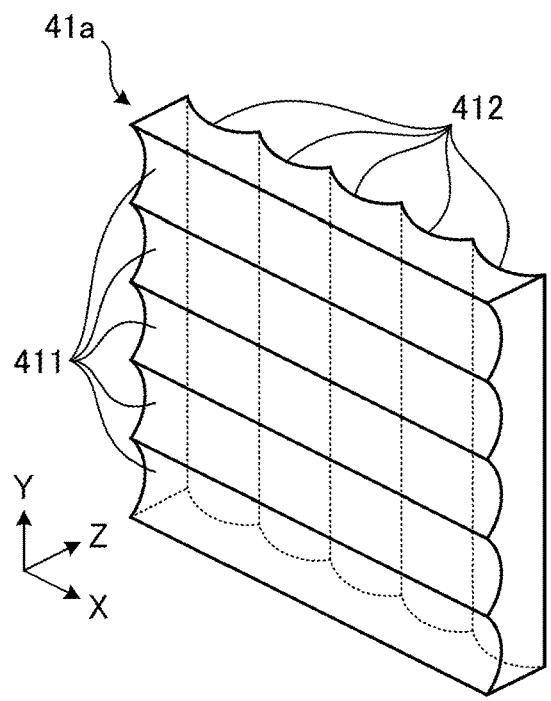
FIG. 24 is a perspective view of an example of a fly-eye lens 41a included in a beam homogenizer 41 in the above-described embodiments.

FIG. 24 is a perspective view of an example of the fly-eye lens 41a included in the above-described beam homogenizer 41. The fly-eye lens 41a may have a substrate to transmit ultraviolet-range light at a high transmittance. The substrate may have a first surface having multiple concave cylindrical surfaces 411 arranged in Y direction. The substrate may have a second surface, opposite to the first surface, having multiple concave cylindrical surfaces 412 arranged in X direction. The front-side focal plane of the cylindrical surface 411 and the front-side focal plane of the cylindrical surface 412 may substantially coincide with each other.

Figure 25:
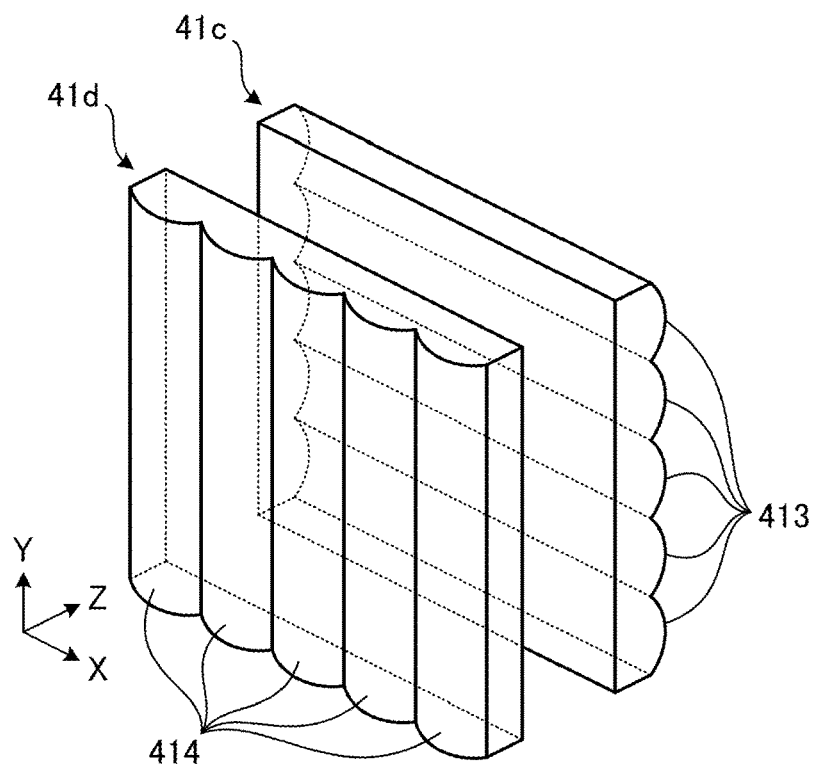
FIG. 25 is a perspective view of a modified example of the fly-eye lens included in the above-described beam homogenizer 41.

FIG. 25 is a perspective view of a modified example of the fly-eye lens included in the above-described beam homogenizer 41. The fly-eye lens may not necessarily be one having cylindrical surfaces in each of the opposite surfaces of a single substrate. The fly-eye lens may have two substrates 41c and 41d having cylindrical surfaces 413 and 414, respectively. The cylindrical surfaces 413 and 414 are not necessarily concave surfaces. They may be convex surfaces. In the other aspects, the fly-eye lens may be similar to that described above with reference to FIG. 24.

9.3 Configuration of Controller

Figure 26:
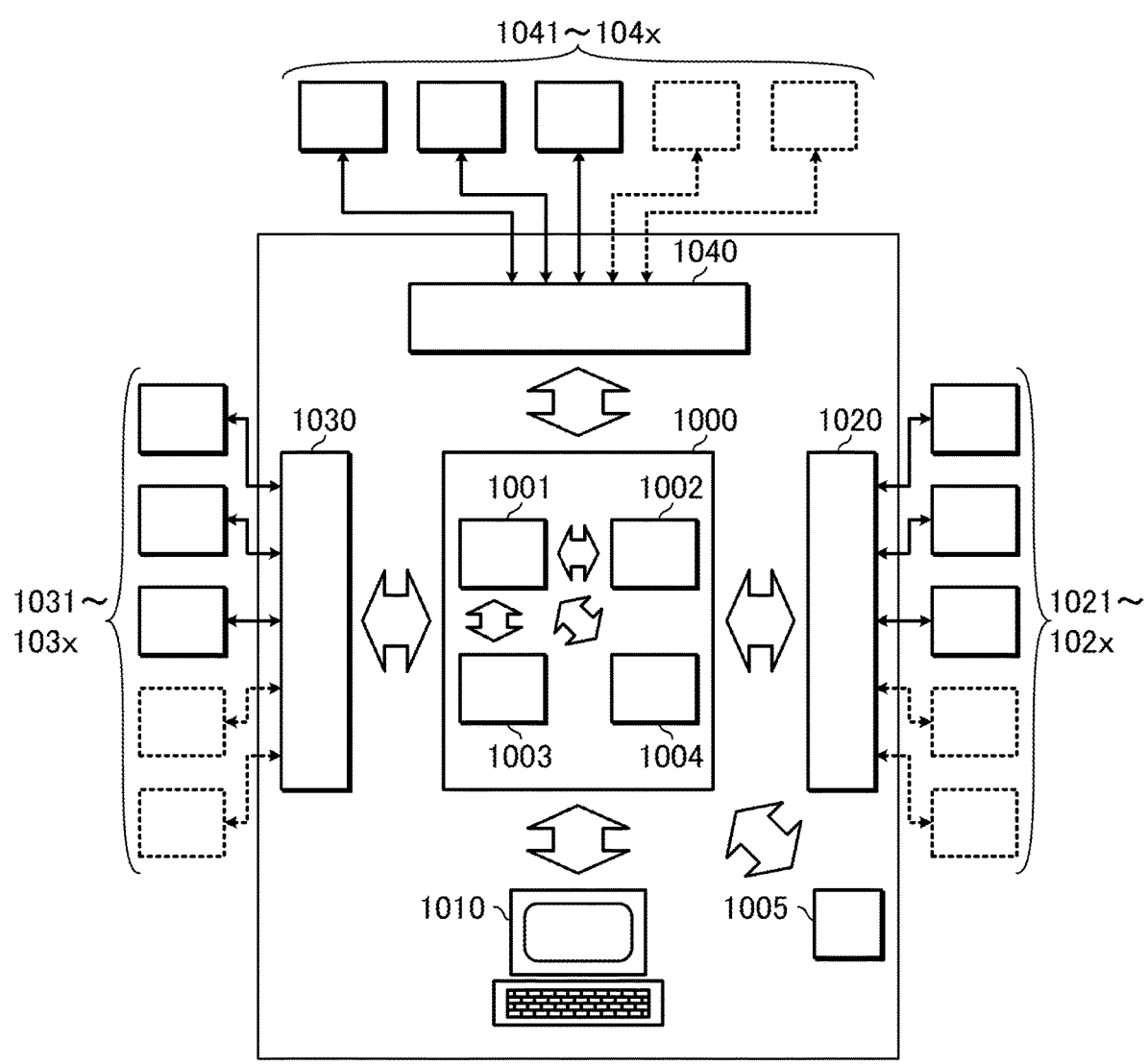
FIG. 26 is a block diagram schematically showing a configuration of the controller.

FIG. 26 is a block diagram schematically showing a configuration of the controller.

Controllers of the above-described embodiments, such as the doping controller 45 and the laser system controller 31, may be general-purpose control devices, such as computers or programmable controllers. For example, the controllers may be configured as follows.

Configuration

The controllers may each include a processor 1000, and a storage memory 1005, a user interface 1010, a parallel input/output (I/O) controller 1020, a serial I/O controller 1030, and an analog-to-digital (A/D) and digital-to-analog (D/A) converter 1040 which are connected to the processor 1000. The processor 1000 may include a central processing unit (CPU) 1001, and a memory 1002, a timer 1003, and a graphics processing unit (GPU) 1004 which are connected to the CPU 1001.

Operation

The processor 1000 may read a program stored in the storage memory 1005, execute the read program, read data from the storage memory 1005 in accordance with the program, or store data in the storage memory 1005.

The parallel I/O controller 1020 may be connected to devices 1021 to 102x with which it may communicate through parallel I/O ports. The parallel I/O controller 1020 may control digital-signal communication through the parallel I/O ports while the processor 1000 executes the program.

The serial I/O controller 1030 may be connected to devices 1031 to 103x with which it may communicate through serial I/O ports. The serial I/O controller 1030 may control digital-signal communication through the serial I/O ports while the processor 1000 executes the program.

The A/D and D/A converter 1040 may be connected to devices 1041 to 104x with which it may communicate through analog ports. The A/D and D/A converter 1040 may control analog-signal communication through the analog ports while the processor 1000 executes the program.

The user interface 1010 may be configured to display the progress of the program being executed by the processor 1000 in accordance with instructions from an operator, or to cause the processor 1000 to stop the execution of the program or perform an interrupt in accordance with instructions from the operator.

The CPU 1001 of the processor 1000 may perform arithmetic processing of the program. The memory 1002 may temporarily store the program being executed by the CPU 1001 or temporarily store data in the arithmetic processing. The timer 1003 may measure time or elapsed time and output it to the CPU 1001 in accordance with the program being executed. When image data is inputted to the processor 1000, the GPU 1004 may process the image data in accordance with the program being executed and output the results to the CPU 1001.

The devices 1021 to 102x, which are connected through the parallel I/O ports to the parallel I/O controller 1020, may be used when the laser device 2 or another apparatus such as the controller receives or sends the emitting trigger signal or other time-indicating signal.

The devices 1031 to 103x, which are connected through the serial I/O ports to the serial I/O controller 1030, may be used when the laser device 2, the optical pulse stretcher 16α, the attenuator 18, the XYZ stage 43g, any controller, or the like sends or receives data.

The devices 1041 to 104x, which are connected through the analog ports to the A/D and D/A converter 1040, may serve as various sensors, such as the pulse waveform measuring unit 19, the display device 44, and the like.

The controllers thus configured may be capable of realizing the operations described in the embodiments.

The above descriptions are intended to be only illustrative rather than being limiting. Accordingly, it will be clear to those skilled in the art that various changes may be made to the embodiments of the present disclosure without departing from the scope of the appended claims.

The terms used in the present specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in the present specification and the appended claims should be interpreted as meaning "at least one" or "one or more".

The invention claimed is:

1. A laser doping apparatus that irradiates a semiconductor substrate with a pulse laser beam to perform doping to the semiconductor substrate, the laser doping apparatus comprising:
   a laser device configured to output first and second pulse laser beams; and
   a controlling device configured to control a time-domain pulse waveform, a fluence, and an irradiated region of each of the first and second pulse laser beams such that
      a first irradiated region of the semiconductor substrate is irradiated with the first pulse laser beam that has a first time-domain pulse waveform and a first fluence, and
      a second irradiated region of the semiconductor substrate, the second irradiated region being different from the first irradiated region, is irradiated with the second pulse laser beam that has a second time-domain pulse waveform and a second fluence, the second time-domain pulse waveform being different from the first time-domain pulse waveform and the second fluence being different from the first fluence, wherein the controlling device includes an optical pulse stretcher configured to control the time-domain pulse waveform of the first pulse laser beam by branching the first pulse laser beam to third and fourth pulse laser beams, delaying the fourth pulse laser beam from the third pulse laser beam, and outputting the third and fourth pulse laser beams.

2. The laser doping apparatus according to claim 1, wherein a maximum optical intensity of the third pulse laser beam outputted from the optical pulse stretcher is higher than a maximum optical intensity of the fourth pulse laser beam outputted from the optical pulse stretcher.

3. The laser doping apparatus according to claim 2, wherein time-domain pulse waveforms of the third and fourth pulse laser beams outputted from the optical pulse stretcher overlap with each other.

4. The laser doping apparatus according to claim 1, wherein the optical pulse stretcher further controls the time-domain pulse waveform of the second pulse laser beam by branching the second pulse laser beam to fifth and sixth pulse laser beams, delaying the sixth pulse laser beam from the fifth pulse laser beam, and outputting the fifth and sixth pulse laser beams.

5. The laser doping apparatus according to claim 4, wherein a maximum optical intensity of the third pulse laser beam outputted from the optical pulse stretcher is higher than a maximum optical intensity of the fourth pulse laser beam outputted from the optical pulse stretcher, and a maximum optical intensity of the fifth pulse laser beam outputted from the optical pulse stretcher is higher than a maximum optical intensity of the sixth pulse laser beam outputted from the optical pulse stretcher.

6. The laser doping apparatus according to claim 5, wherein time-domain pulse waveforms of the third and fourth pulse laser beams outputted from the optical pulse stretcher overlap with each other, and time-domain pulse waveforms of the fifth and sixth pulse laser beams outputted from the optical pulse stretcher overlap with each other.

7. The laser doping apparatus according to claim 1, wherein the controlling device includes an attenuator configured to control the fluence of each of the first and second pulse laser beams.

8. The laser doping apparatus according to claim 1, wherein the controlling device includes a variable slit configured to control the irradiated region of each of the first and second pulse laser beams.

9. The laser doping apparatus according to claim 1, wherein the controlling device controls the time-domain pulse waveform, the fluence, and the irradiated region of each of the first and second pulse laser beams such that dopant concentration in the first irradiated region is higher than dopant concentration in the second irradiated region, and doping depth in the first irradiated region is smaller than doping depth in the second irradiated region.

10. The laser doping apparatus according to claim 1, wherein the controlling device controls the time-domain pulse waveform, the fluence, and the irradiated region of each of the first and second pulse laser beams such that the first fluence is higher than the second fluence, and a first pulse width shown in the first time-domain pulse waveform is smaller than a second pulse width shown in the second time-domain pulse waveform.

11. The laser doping apparatus according to claim 1, wherein the pulse laser beam has a wavelength of 248 nm or more and 308 nm or less.

12. A laser doping apparatus that irradiates a semiconductor substrate with a pulse laser beam to perform doping to the semiconductor substrate, the laser doping apparatus comprising:

a laser device configured to output first and second pulse laser beams; and a controlling device configured to control a time-domain pulse waveform, a fluence, and an irradiated region of each of the first and second pulse laser beams such that a first irradiated region of the semiconductor substrate is irradiated with the first pulse laser beam that has a first time-domain pulse waveform and a first fluence, and a second irradiated region of the semiconductor substrate, the second irradiated region being different from the first irradiated region, is irradiated with the second pulse laser beam that has a second time-domain pulse waveform and a second fluence, the second time-domain pulse waveform being different from the first time-domain pulse waveform and the second fluence being different from the first fluence, wherein the laser device includes:

a first laser unit configured to output seventh and eighth pulse laser beams;

a second laser unit configured to output ninth and tenth pulse laser beams; and an optical system configured to combine the seventh and ninth pulse laser beams to output the first pulse laser beam, and combine the eighth and tenth pulse laser beams to output the second pulse laser beam.

13. The laser doping apparatus according to claim 12, wherein the controlling device includes a delay circuit configured to control the time-domain pulse waveform of the first pulse laser beam by outputting a first trigger signal to the first laser unit such that the first laser unit outputs the seventh pulse laser beam at a first timing, and outputting a second trigger signal to the second laser unit such that the second laser unit outputs the ninth pulse laser beam at a second timing after the first timing.

14. The laser doping apparatus according to claim 13, wherein the controlling device sets target values of pulse energy of the first and second laser units such that a maximum optical intensity of the seventh pulse laser beam outputted from the optical system is higher than a maximum optical intensity of the ninth pulse laser beam outputted from the optical system.

15. The laser doping apparatus according to claim 14, wherein time-domain pulse waveforms of the seventh and ninth pulse laser beams outputted from the optical system overlap with each other.

16. The laser doping apparatus according to claim 13, wherein the delay circuit further controls the time-domain pulse waveform of the second pulse laser beam by
  outputting a third trigger signal to the first laser unit such that the first laser unit outputs the eighth pulse laser beam at a third timing, and
  outputting a fourth trigger signal to the second laser unit such that the second laser unit outputs the tenth pulse laser beam at a fourth timing after the third timing.

17. The laser doping apparatus according to claim 16, wherein
  the controlling device sets target values of pulse energy of the first and second laser units such that a maximum optical intensity of the seventh pulse laser beam outputted from the optical system is higher than a maximum optical intensity of the ninth pulse laser beam outputted from the optical system and a maximum optical intensity of the eighth pulse laser beam outputted from the optical system is higher than a maximum optical intensity of the tenth pulse laser beam outputted from the optical system.

18. The laser doping apparatus according to claim 17, wherein
  time-domain pulse waveforms of the seventh and ninth pulse laser beams outputted from the optical system overlap with each other, and
  time-domain pulse waveforms of the eighth and tenth pulse laser beams outputted from the optical system overlap with each other.

19. The laser doping apparatus according to claim 12, wherein the controlling device includes an attenuator configured to control the fluence of each of the first and second pulse laser beams.

20. A laser doping method to irradiate a semiconductor substrate with a pulse laser beam to perform doping to the semiconductor substrate, the method comprising:
  outputting first and second pulse laser beams; and
  controlling a time-domain pulse waveform, a fluence, and an irradiated region of each of the first and second pulse laser beams such that
    a first irradiated region of the semiconductor substrate is irradiated with the first pulse laser beam that has a first time-domain pulse waveform and a first fluence, and
    a second irradiated region of the semiconductor substrate, the second irradiated region being different from the first irradiated region, is irradiated with the second pulse laser beam that has a second time-domain pulse waveform and a second fluence, the second time-domain pulse waveform being different from the first time-domain pulse waveform and the second fluence being different from the first fluence, wherein
  the first time-domain pulse waveform of the first pulse laser beam is controlled with an optical pulse stretcher by
    branching the first pulse laser beam to third and fourth pulse laser beams,
    delaying the fourth pulse laser beam from the third pulse laser beam, and
    outputting the third and fourth pulse laser beams.

\* \* \* \* \*